(12) United States Patent
Imanaka et al.

(10) Patent No.: US 8,278,217 B2
(45) Date of Patent: Oct. 2, 2012

(54) SEMICONDUCTOR DEVICE AND METHOD OF PRODUCING THE SAME

(75) Inventors: Yoshihiko Imanaka, Kawasaki (JP); Jun Akedo, Tsukuba (JP)

(73) Assignees: Fujitsu Limited, Kawasaki (JP); National Institute of Advanced Industrial Science and Technology, Tokyo (JP)

( * ) Notice: Subject to any disclaimer, the term of this patent is extended or adjusted under 35 U.S.C. 154(b) by 859 days.

(21) Appl. No.: 11/250,409

(22) Filed: Oct. 17, 2005

(65) Prior Publication Data

US 2006/0087029 A1 Apr. 27, 2006

(30) Foreign Application Priority Data

Oct. 22, 2004 (JP) ................... 2004-308620

(51) Int. Cl.
H01L 21/311 (2006.01)
(52) U.S. Cl. ........................ 438/683; 257/183
(58) Field of Classification Search .................. 438/183; 257/698
See application file for complete search history.

(56) References Cited

U.S. PATENT DOCUMENTS

| | | | |
|---|---|---|---|
| 5,834,824 A * | 11/1998 | Shepherd et al. | 257/530 |
| 5,872,338 A * | 2/1999 | Lan et al. | 174/255 |
| 6,251,488 B1 | 6/2001 | Miller | |
| 6,545,354 B1 | 4/2003 | Aoki et al. | |
| 6,639,299 B2 | 10/2003 | Aoki | |
| 7,180,418 B1 * | 2/2007 | Willms et al. | 340/568.1 |
| 2003/0048314 A1 * | 3/2003 | Renn | 347/6 |
| 2003/0108664 A1 * | 6/2003 | Kodas et al. | 427/125 |
| 2004/0109939 A1 * | 6/2004 | Sadasivan et al. | 427/58 |
| 2007/0145568 A1 * | 6/2007 | Ogawa | 257/698 |

FOREIGN PATENT DOCUMENTS

| | | |
|---|---|---|
| JP | 8-222405 A | 8/1996 |
| JP | 9-64236 | 3/1997 |
| JP | 2000-235979 A | 8/2000 |
| JP | 2002-314028 A | 10/2002 |
| JP | 2002-544387 A | 12/2002 |
| JP | 2003-59703 A | 2/2003 |
| JP | 2003-133476 A | 5/2003 |
| JP | 2003-289128 | 10/2003 |
| JP | 2004-146750 A | 5/2004 |

OTHER PUBLICATIONS

Japanese Office Action dated May 19, 2009, issued in corresponding Japanese Application No. 2004-308620.

* cited by examiner

*Primary Examiner* — Howard Weiss
*Assistant Examiner* — Steven Rao
(74) *Attorney, Agent, or Firm* — Westerman, Hattori, Daniels & Adrian, LLP

(57) ABSTRACT

A semiconductor device includes a semiconductor chip having a surface provided with connecting electrodes, a stacked structure made up of alternately stacked dielectric and wiring layers and provided on the surface of the semiconductor chip, a passive element provided in the stacked structure and electrically connected to the wiring layers; and external electrodes for external electrical connection provided on the stacked structure and electrically connected to the connecting electrodes via the wiring layers. The passive element has at least one layer selected from a group consisting of a capacitor dielectric layer, a resistor layer and a conductor layer that are formed by spraying an aerosol particulate material.

18 Claims, 14 Drawing Sheets

SEMICONDUCTOR DEVICE AND METHOD OF PRODUCING THE SAME

BACKGROUND OF THE INVENTION

This application claims the benefit of a Japanese Patent Application No.2004-308620 filed Oct. 22, 2004, in the Japanese Patent Office, the disclosure of which is hereby incorporated by reference.

1. Field of the Invention

The present invention generally relates to semiconductor devices and methods of producing the same, and more particularly to a semiconductor device having a semiconductor chip and a layer formed by spraying an aerosol particulate material, and a method of producing such a semiconductor device.

2. Description of the Related Art

The miniaturization and performance of electronic equipments have improved rapidly in various fields such as personal computers, portable telephones, Bluetooth (registered trademark) and other mobile equipments, aiming for an ubiquitous society, and there are demands to develop portable, wearable, mobile electronic equipments. In order to miniaturize such electronic equipments, there are demands to further improve the integration density of the packaging technology and the integration density of high-frequency circuits.

Particularly in the case of a large scale integrated circuit (LSI) chip, the integration, operation speed and functions have improved considerably, and LSI chips having approximately 3,000,000 gates within a single LSI chip and operating at a clock frequency of 500 MHz have been realized. In addition, the so-called system-on-chips have been developed, where the system-on-chip is mounted with a plurality of central processing units (CPUs), read only memories (ROMs), digital signal processors (DSPs) and the like.

In such an LSI chip using digital signals, a decoupling capacitor is provided in a periphery of the LSI chip in order to instantaneously flow an excessive current that is generated when a digital circuit of the LSI chip carries out a switching. The decoupling capacitor is provided between a power supply line and a ground line.

FIGS. 1 through 3 are cross sectional views showing examples of conventional circuit devices.

Conventionally, a decoupling capacitor 201 is arranged on a circuit board 203 on which an LSI chip 202 is mounted, as shown in FIG. 1. The decoupling capacitor 201 is electrically connected to the LSI chip 202 via wirings 204 and 205 of the circuit board 203.

In FIG. 2, the decoupling capacitor 201 is provided inside a multi-layer (or multi-level) circuit board 206 on which the LSI chip 202 is mounted.

In FIG. 3, the decoupling capacitor 201 is provided inside an interposer 210 that is provided between the LSI chip 202 and a circuit board 209. For example, a Japanese Laid-Open Patent Application No.2003-289128 proposes such an arrangement.

On the other hand, a circuit device having a semiconductor chip and a multi-layer wiring (or multi-level interconnection) board that are bonded without the use of bumps, where the decoupling capacitor is preformed within the multi-layer wiring board, has been proposed in a Japanese Laid-Open Patent Application 9-64236, for example.

However, in a case where a resin insulator layer made of an epoxy resin or the like is used for an interlayer insulator of the multi-layer wiring board, a resin that is mixed with ceramic powder is used for a capacitor dielectric layer of the decoupling capacitor due to the low heat resistance of the resin insulator layer. Since the dielectric constant of such a capacitor dielectric layer is approximately 10, it is impossible to form a decoupling capacitor having a sufficiently large electrostatic capacitance, and it is difficult to sufficiently bring out the functions of the decoupling capacitor.

In addition, in a case where sintered barium titanate is used for the capacitor dielectric layer, it is only possible to form one layer on a substrate having a high heat resistance of 800° C. to 1000° C. or higher, and there is a limit to the electrostatic capacitance that can be realized. Moreover, since a sintering process at a high temperature is required, the dimensions change after the sintering due to contraction or bowing, for example. For this reason, it is difficult to make the electrical connection and bonding with respect to the flat LSI chip having a high pin density, and there is a possibility of generating a defective connection or a disconnection.

Furthermore, problems similar to the above described problems encountered in the case of the decoupling capacitor are encountered when providing a damping resistor element and a terminating resistor element on the multi-layer wiring substrate.

SUMMARY OF THE INVENTION

Accordingly, it is a general object of the present invention to provide a novel and useful semiconductor device and method of producing the same, in which the problems described above are suppressed.

Another and more specific object of the present invention is to provide a semiconductor device and a method of producing the same, which can realize a high-speed operation of the semiconductor device.

Still another object of the present invention is to provide a semiconductor device comprising a semiconductor chip having a surface provided with connecting electrodes; a stacked structure, made up of alternately stacked dielectric and wiring layers, provided on the surface of the semiconductor chip; a passive element, provided in the stacked structure, and electrically connected to the wiring layers; and external electrodes for external electrical connection, provided on the stacked structure and electrically connected to the connecting electrodes via the wiring layers, where the passive element comprises at least one layer selected from a group consisting of a capacitor dielectric layer, a resistor layer and a conductor layer that are formed by spraying an aerosol particulate material. According to the semiconductor device of the present invention, the capacitance, resistance and inductance of the one layer are approximately the same as those of the bulk particulate material, thereby making it possible to provide the passive element adjacent to the semiconductor chip. For this reason, it is possible to realize a high-speed operation because the wiring length and the stray inductance of the wiring can be reduced.

A further object of the present invention is to provide a method of producing a semiconductor device comprising forming a stacked structure, made up of alternately stacked dielectric and wiring layers, on a surface of a semiconductor chip, the surface having connecting electrodes and a protection layer provided thereon; and forming external electrodes for external electrical connection on the stacked structure so that the external electrodes are electrically connected to the semiconductor chip via the wiring layers, where the forming the stacked structure comprises a process of forming a lower electrode; a process of spraying an aerosol particulate material so as to cover the lower electrode and forming one layer selected from a group consisting of a capacitor dielectric layer, a resistor layer and a conductor layer; a process of selectively removing the one layer; and a process of forming an upper electrode on the one layer. According to the method of producing the semiconductor device of the present invention, the capacitance, resistance and inductance of the one layer are approximately the same as those of the bulk particulate material, thereby making it possible to provide the passive element adjacent to the semiconductor chip. For this reason, it is possible to produce a semiconductor device capable of carrying out a high-speed operation because the wiring length and the stray inductance of the wiring can be reduced.

Another object of the present invention is to provide an electronic apparatus comprising a substrate having a stacked structure and a passive element, the stacked structure being made up of alternately stacked dielectric and wiring layers; and a semiconductor chip provided on the substrate, where the passive element comprises at least one layer selected from a group consisting of a capacitor dielectric layer, a resistor layer and a conductor layer that are formed by spraying an aerosol particulate material. According to the electronic apparatus of the present invention, the capacitance, resistance and inductance of the one layer are approximately the same as those of the bulk particulate material, thereby making it possible to provide the passive element adjacent to the semiconductor chip. For this reason, it is possible to realize a high-speed operation because the wiring length and the stray inductance of the wiring can be reduced.

Still another object of the present invention is to provide a method of producing a semiconductor device comprising forming a stacked structure, made up of alternately stacked dielectric and wiring layers; and the forming the stacked structure comprising a process of forming a lower electrode; a process of spraying an aerosol particulate material so as to cover the lower electrode and forming one layer selected from a group consisting of a capacitor dielectric layer, a resistor layer and a conductor layer; a process of selectively removing the one layer; and a process of forming an upper electrode on the one layer. According to the method of producing the semiconductor device of the present invention, the capacitance, resistance and inductance of the one layer are approximately the same as those of the bulk particulate material, thereby making it possible to provide the passive element adjacent to the semiconductor chip. For this reason, it is possible to realize an electronic apparatus capable of carrying out a high-speed operation because the wiring length and the stray inductance of the wiring can be reduced.

Other objects and further features of the present invention will be apparent from the following detailed description when read in conjunction with the accompanying drawings.

DESCRIPTION OF THE PREFERRED EMBODIMENTS

[First Embodiment]

Figure 1:
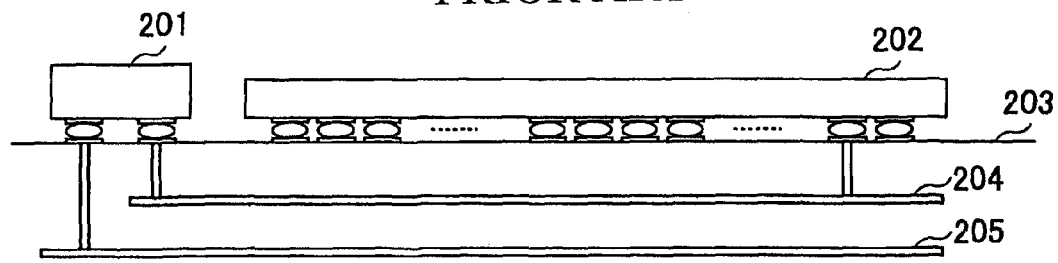
FIG. 1 is a cross sectional view showing an example of a conventional circuit device.
Figure 2:
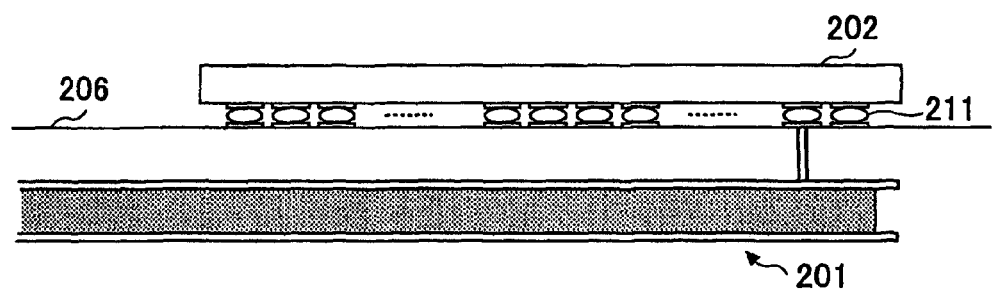
FIG. 2 is a cross sectional view showing another example of the conventional circuit device.
Figure 3:
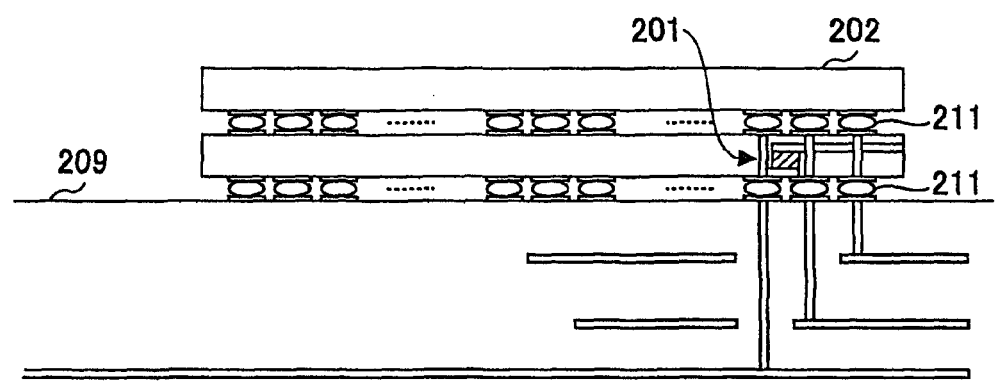
FIG. 3 is a cross sectional view showing still another example of the conventional circuit device.
Figure 4:
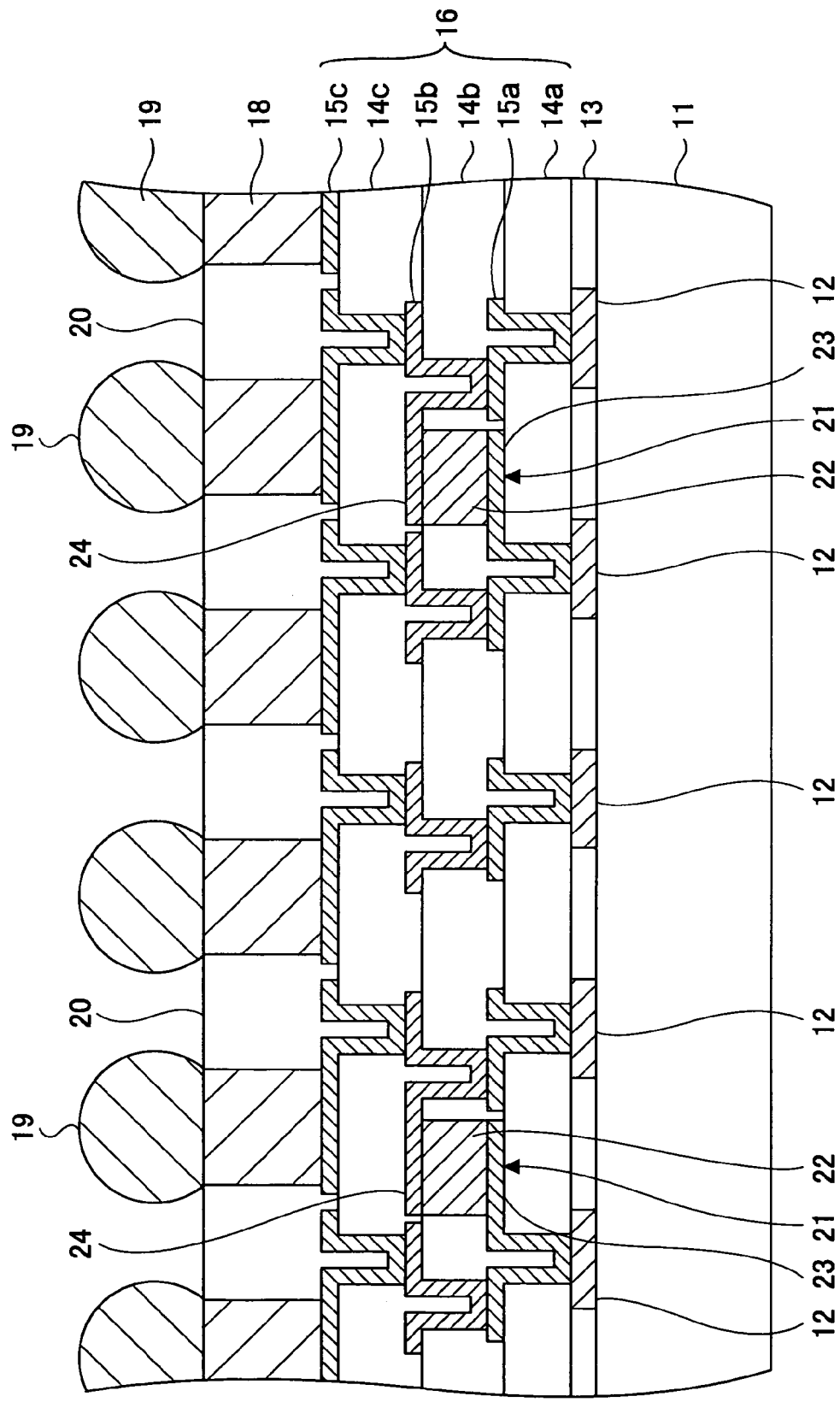
FIG. 4 is a cross sectional view showing an important part of a first embodiment of a semiconductor device according to the present invention.

FIG. 4 is a cross sectional view showing an important part of a first embodiment of a semiconductor device according to the present invention. A semiconductor device 10 shown in FIG. 4 includes a semiconductor chip 11, connecting electrodes 12 and a protection layer 13 provided on a surface of the semiconductor chip 11, a stacked wiring structure 16 covering the surface of the connecting electrodes 12 and the protection layer 13, electrode pads 18 and solder bumps 19 formed as external terminals on a surface of the stacked wiring structure 16, and an encapsulating resin layer 20 covering the surface of the stacked wiring structure 16. The stacked wiring structure 16 is made up of alternately stacked dielectric layers 14 and wiring layers 15. In the case shown in FIG. 4, the stacked wiring structure 16 includes 3 dielectric layers 14a, 14b and 14c, and 3 wiring layers 15a, 15b and 15c.

Decoupling capacitors 21 are provided within the stacked wiring structure 16. The decoupling capacitor 21 is made up of an upper electrode 24 and a lower electrode 23 which sandwich a capacitor dielectric layer 22. The upper electrode 24 and the lower electrode 23 are formed by extending portions of the wiring layers 15b and 15a. As will be described later in more detail, the capacitor dielectric layer 22 is formed by spraying an aerosol dielectric particulate material directly on a region where the capacitor dielectric layer 22 is to be formed, by using an Aerosol Deposition (AD) method.

For example, oxide ceramics or nitride ceramics, such as $TiO_2$, $MgO$, $Al_2O_3$, $SiO_2$ and $AlN$, may be used for the dielectric particulate material. In addition, ceramics having a perovskite structure or a simple perovskite lattice crystal structure, such as $BaTiO_3$, $Ba(Mg_{1/3}Ta_{2/3})O_3$, $Ba(Co_{1/3}Ta_{2/3})O_3$, $Ba(Co_{1/3}Nb_{2/3})O_3$, $Ba(Ni_{1/3}Ta_{2/3})O_3$, $(BaSr)TiO_3$, $Ba(TiZr)O_3$, $Ba(Zn_{1/3}Nb_{2/3})O_3$, $Ba(Zn_{1/3}Ta_{2/3})O_3$, $BaTi_4O_9$, $Ba_2Ti_9O_{20}$, $CaTiO_3$, $CaZrO_3$, $MgTiO_3$, $Nd_2Ti_2O_7$, $Pb(Mg_{1/3}Nb_{2/3})O_3$, $PbTiO_3$, $PbZrO_3$, $PbZrTiO_3$, $Pb(Ni_{1/3}Nb_{2/3})O_3$, $Pb(Zn_{1/3}Nb_{2/3})O_3$, $SrTiO_3$ and $ZrSnTiO_4$, may be used for the dielectric particulate material.

From the point of view of obtaining a high permittivity and low loss at high frequencies, one element or a mixture of two or more elements is preferably selected from $TiO_2$, $BaTiO_3$, $(BaSr)TiO_3$, $Ba(Mg_{1/3}Ta_{2/3})O_3$, $Ba(TiZr)O_3$, $Ba(Zn_{1/3}Nb_{2/3})O_3$, $Ba(Zn_{1/3}Ta_{2/3})O_3$, $BaTi_4O_9$, $Ba_2Ti_9O_{20}$, $Pb(Mg_{1/3}Nb_{2/3})O_3$, $Pb(Ni_{1/3}Nb_{2/3})O_3$, $PbZrTiO_3$ and $ZrSnTiO_4$ and used for the dielectric particulate material.

It is preferable that the average grain diameter of the dielectric particulate material is in a range of 10 nm to 10 μm. If the average grain diameter of the dielectric particulate material is less than 10 nm, the bonding strength between the capacitor dielectric layer 22 and the lower electrode 23 or the like becomes insufficient. On the other hand, if the average grain diameter of the dielectric particulate material is greater than 10 μm, it becomes difficult to form a continuous dielectric layer and the capacitor dielectric layer 22 becomes fragile.

The dielectric particulate material may have an aluminum compound formed on the surface thereof, which aluminum compound functions as a binder for the dielectric particulate material. For example, the aluminum compound may be selected from Al2O3, aluminum hydroxide (Al(OH)3) and aluminum alkoxide (Al(OR)3(R: alkyl group)). In addition, aluminum tri-methoxide, aluminum tri-ethoxide, aluminum tri-n-propoxide, aluminum tri-isopropoxide, aluminum tri-n-butoxide, aluminum tri-sec-butoxide, aluminum tri-tert-butoxide, mono sec butoxy aluminum di-isopropylate, aluminum tri-ethoxy ethoxy ethoxide and aluminum phenoxide may be used for the aluminum alkoxide.

The binder made of the aluminum compound described above preferably has a mass % in a range of 0.1 mass % to 50 mass %, and more preferably in a range of 0.1 mass % to 20 mass %, when the weight of the dielectric particulate material added with the binder is taken as a reference (100 mass %).

Figure 5A:
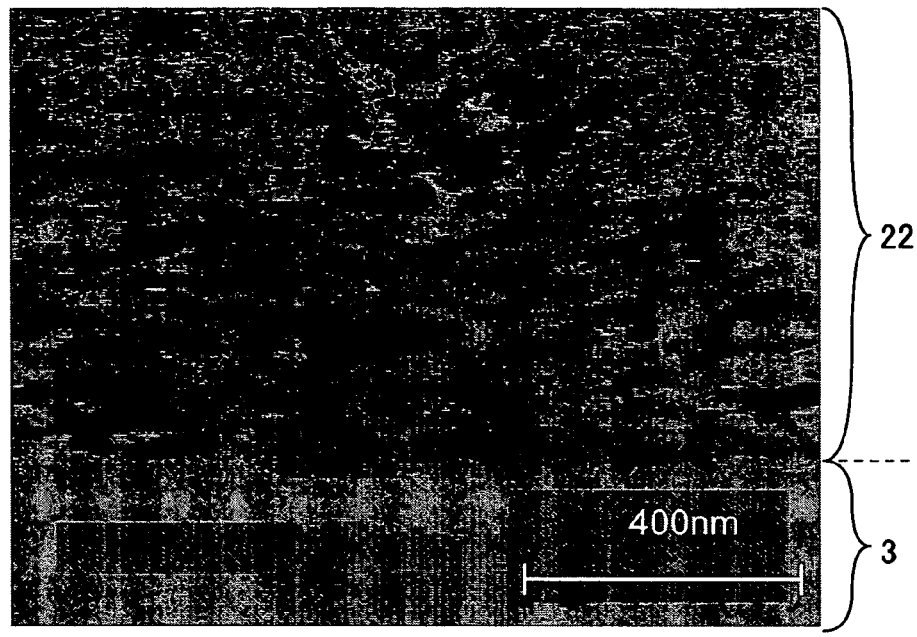
FIGS. 5A and 5B respectively are a TEM photograph and a schematic diagram showing a cross section of a capacitor dielectric layer.
Figure 5B:
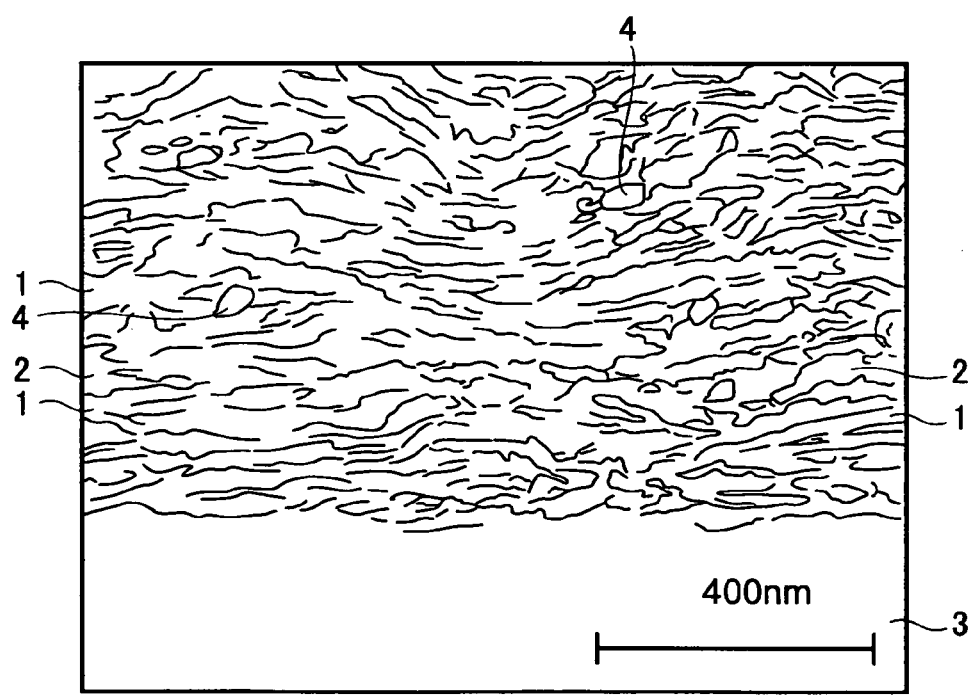

FIGS. 5A and 5B respectively are a Transmission Electron Microscope (TEM) photograph and a schematic diagram showing a cross section of the capacitor dielectric layer 22. The capacitor dielectric layer 22 shown in FIG. 5A has an average grain diameter of 0.5 μm, and is formed by spraying $TiO_2$ particulates coated with $Al_2O_3$ on the substrate surface from above the substrate.

As may be seen from FIGS. 5A and 5B, the capacitor dielectric layer 22 includes bright portions 1 and dark portions 2 which contiguously overlap substantially in the form of layers. According to the analysis made by the present inventors, a large amount of $Al_2O_3$ is included in the bright portions 1, and a large amount of $TiO_2$ is included in the dark portions 2. In other words, since the $TiO_2$ particulates coated with $Al_2O_3$ are sprayed at a high speed on the surface of a substrate 3 or on the surface of a layer provided on the substrate 3 in a direction from the top towards the bottom in FIGS. 5A and 5B, it may be seen that the $TiO_2$ particulates coated with $Al_2O_3$ become squashed vertically and assume the flat or layer shape. It may be regarded that a newly created surface appears on the surface of each of the overlapping portions 1 and 2 due to the shock when the sprayed $TiO_2$ particulates coated with $Al_2O_3$ hit the surface, and that the particulates are strongly bonded to each other via the newly created surface. In FIG. 5B, a dark black granular portion 4 is an air hole that is formed when adjusting the sample for the TEM.

Returning now to the description of FIG. 4, the capacitor dielectric layer 22 preferably has a thickness in a range of 50 nm to 50 μm, and more preferably has a thickness in a range of 500 nm to 5 μm from the point of view of obtaining a large electrostatic capacitance with a small area. If the thickness of the capacitor dielectric layer 22 is less than 500 nm, it may not be possible to obtain a fine continuous layer, but the thickness may be less than 500 nm if a fine continuous layer can be obtained depending on the dielectric particulate material.

The upper and lower electrodes 24 and 23 are respectively made of a conductive material such as Au, Al, Pt, Ag, Pd, Cu and alloys thereof, and have a thickness of 1 μm, for example. The conductive material used for the upper and lower electrodes 24 and 23 is not limited to a particular material. But from the point of view of the electrical resistance and the non-magnetic property, Au, Pt, Ag, Pd and Cu are suitably used for the conductive material forming the upper and lower electrodes 24 and 23. As shown in FIG. 4, it is preferable that the upper and lower electrodes 24 and 23 respectively form approximately the same plane as in-plane wirings of the corresponding wiring layers 15b and 15a provided on the respective dielectric layers 14b and 14a.

The wiring layers 15a through 15c are made of a conductive material having a thickness of 1 μm, for example. The conductive material forming the wiring layers 15a through 15c may be similar to the conductive materials forming the upper and lower electrodes 24 and 23. Preferably, the wiring layers 15a through 15c that are formed on the same plane as the upper electrode 24 or the lower electrode 23 are made of the same conductive material as the upper electrode 24 or the lower electrode 23.

The dielectric layers 14a through 14c are made of a resin material having a thickness of 5 μm, for example. From the point of view of the fluidity of the resin solution and the heat resistance after curing, it is preferable to use a thermosetting resin for the dielectric layers 14a through 14c. The thermosetting resin may be selected from resins such as epoxy resin, phenol resin, unsaturated polyester resin, silicon resin, benzocyclobutene (BCB), vinyl resin, vinyl ester resin and polyimide resin. The epoxy resin is preferable in that the thermosetting temperature is 200° C. or less and the thermal damage can be reduced. The polyimide resin is preferable in that the heat resistance is high and the permittivity is low. The BCB is particularly preferable in that the viscosity is low, the thermosetting temperature is low, and a planar surface is easily obtained. In addition, from the point of view of obtaining a low permittivity and suppressing the CR delay, the dielectric layers 14a through 14c are preferably made of a bis maleimide triazine resin or a maleimide styryl resin.

The encapsulating resin layer 20 covers the wiring layer 15c, the dielectric layer 14c and the sidewalls of the electrode pads 18. The encapsulating resin layer 20 is made of a vapor or moisture resistant polyimide resin or epoxy resin. The encapsulating resin layer 20 may also cover the outer peripheral portion on the surface of the electrode pads 18, so as to prevent moisture from entering via the interface between the electrode pads 18 and the encapsulating resin layer 20.

Although the illustration thereof will be omitted in FIG. 4, the semiconductor chip 11 that is used in the semiconductor device 10 of this embodiment is made of a semiconductor substrate, such as a silicon substrate, and semiconductor circuits provided on the substrate. The semiconductor circuits include CPUs, ROMs, RAMs, DSPs and the like. The connecting electrodes 12 and the protection layer 13 are formed on the surface of the semiconductor circuits. The protection layer 13 is made of a silicon oxide layer, a silicon nitride layer or, a multi-layer of such layers that are stacked. The semiconductor chip 11 may be a general-purpose LSI or an Application Specific Integrated Circuit (ASIC).

The capacitor dielectric layer 22 is formed so as not to become exposed at the side surface of the stacked wiring structure 16. For example, the capacitor dielectric layer 22 is surrounded by the dielectric layer 14b and the wiring layers 15a and 15b, as shown in FIG. 4. Even if the side surface of the stacked wiring structure 16 is exposed to the outside, it is possible to prevent external moisture from entering into the capacitor dielectric layer 22 to thereby prevent deterioration of the capacitor dielectric layer 22.

According to this embodiment of the semiconductor device, the capacitor dielectric layer 22 is formed by the AD method using the dielectric particulate material, and the permittivity of the capacitor dielectric layer 22 is close to the permittivity of the bulk of the dielectric particulate material. For example, when the capacitor dielectric layer 22 is made of the $BaTiO_3$ particulate material, the relative permittivity becomes 1500 (when a high-frequency measurement is made at 1 GHz). Hence, it is possible to form the decoupling capacitor 21 that has a large electrostatic capacitance. Furthermore, by appropriately setting the dimensions including the thickness of the capacitor dielectric layer 22, it is possible to form decoupling capacitors 21 having various electrostatic capacitances. By connecting such decoupling capacitors having the various electrostatic capacitances, it is possible to form a group of decoupling capacitors 21 that is effective with respect to a wide frequency band. As a result, a high-speed data transfer can be realized and the semiconductor device 10 can realize a high-speed operation.

This embodiment of the semiconductor device uses the decoupling capacitor 21. However, it is of course possible to similarly form the capacitor dielectric layer by the AD method and provide capacitors other than the decoupling capacitor 21.

FIGS. 6A through 6F are cross sectional views for explaining a first embodiment of a method of producing the semiconductor device according to the present invention. A description will be given of the method of producing the semiconductor device 10 described above, by referring to FIGS. 6A through 6F.

Figure 6A:
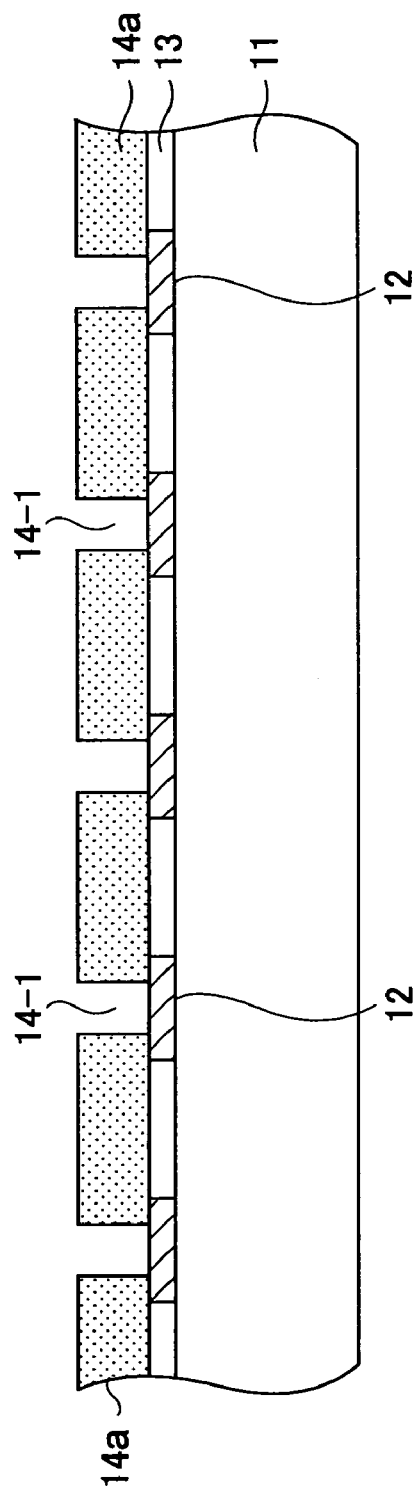
FIGS. 6A through 6F are cross sectional views for explaining a first embodiment of a method of producing the semiconductor device according to the present invention.

First, in a process shown in FIG. 6A, a semiconductor circuit (not shown) is formed on silicon wafer having a diameter of 300 mm, used as the semiconductor substrate, and the connecting electrodes 12 and the protection layer 13 made of the polyimide resin, for example, are formed on the surface of the semiconductor circuit. The semiconductor circuit, the connecting electrodes 12 and the protection layer 13 may be formed by known methods.

In addition, in the process shown in FIG. 6A, the dielectric layer 14a is formed on the surfaces of the connecting electrodes 12 and the protection layer 13. For example, the dielectric layer 14a is formed by coating an insulative photosensitive polyimide resin liquid by a spin-coating method and drying the same at a heating temperature of 80° C. for a heating time of 30 minutes. Next, the dielectric layer 14a is patterned to form openings 14-1 that expose the surfaces of the connecting electrodes 12, and a heating process is carried out to cure the dielectric layer 14a. For example, a photonice UR-3100 (product name) manufactured by Toray Industries, Inc. may be used as the insulative photosensitive polyimide resin. The photosensitive polyimide resin liquid may be coated by methods other than the spin-coating method, such as the screen printing method, spraying method, curtain coating method, roll coating method and the dipping method. Moreover, the heating process that is carried out to cure the dielectric layer 14a may be carried out at a heating temperature of 350° C. for a processing time of 30 minutes, for example.

Figure 6B:
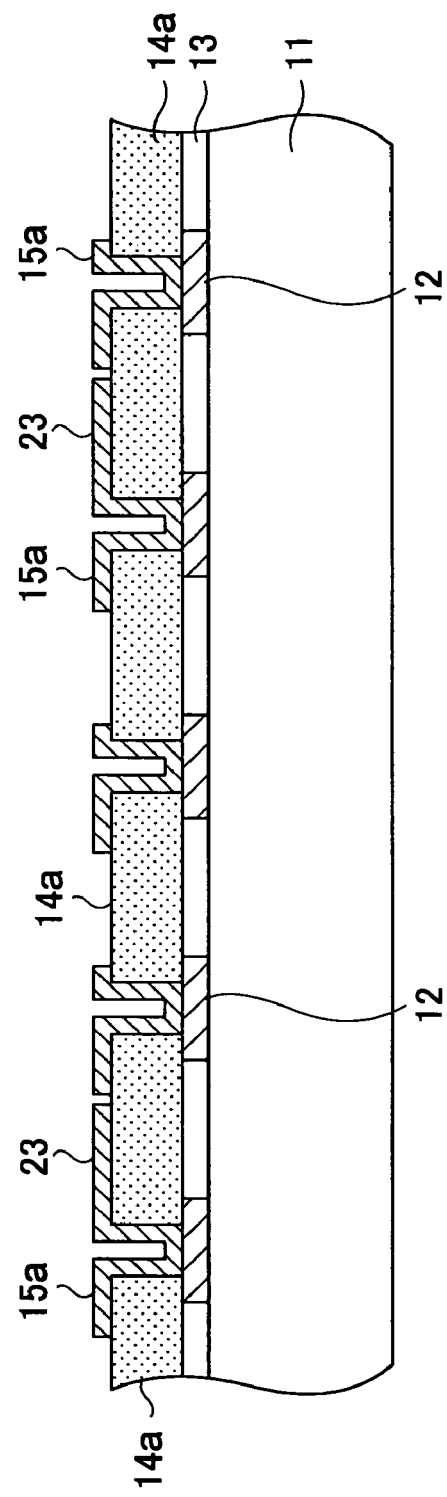

In a process shown in FIG. 6B, a plated seed layer (not shown) is sputtered on the surface of the structure obtained by the process shown in FIG. 6A. For example, the seed layer is made up of a Cr layer having a thickness of 20 nm and a Cu layer having a thickness of 20 nm. The plated seed layer may be formed by methods other than the sputtering method, such as the electroless plating. When employing the electroless plating, the surface of the dielectric layer 14a is roughened by a permanganate salt solution, a catalizing process is carried out to adhere a catalyst on the surface, and an electroless Cu plated layer is formed thereon.

In the process shown in FIG. 6B, a Cu plated layer, which becomes the wiring layer 15a, is formed to a thickness of 5 μm on the entire surface of the seed layer by electroplating. The lower electrode 23 extending in the in-plane wiring is formed simultaneously.

Further, in the process shown in FIG. 6B, a resist layer (not shown) is formed on the surface of the Cu plated layer, and the wiring pattern of the wiring layer 15a is formed on the resist layer. Then, the resist layer is used as a mask, and a wet etching is carried out to form the wiring layer 15a by etching the Cu plated layer and the plated seed layer. For example, the resist layer is formed to a thickness of 10 μm. A glass mask formed with the pattern of the wiring layer 15a is made to contact the resist layer, and a mercury lamp is used as a light source to expose the resist layer by an ultraviolet ray at an irradiation energy of 400 $mJ/cm^2$. Of course, it is possible to use an exposure apparatus using a light source that emits an X-ray for the exposure instead of the ultraviolet ray.

Figure 6C:
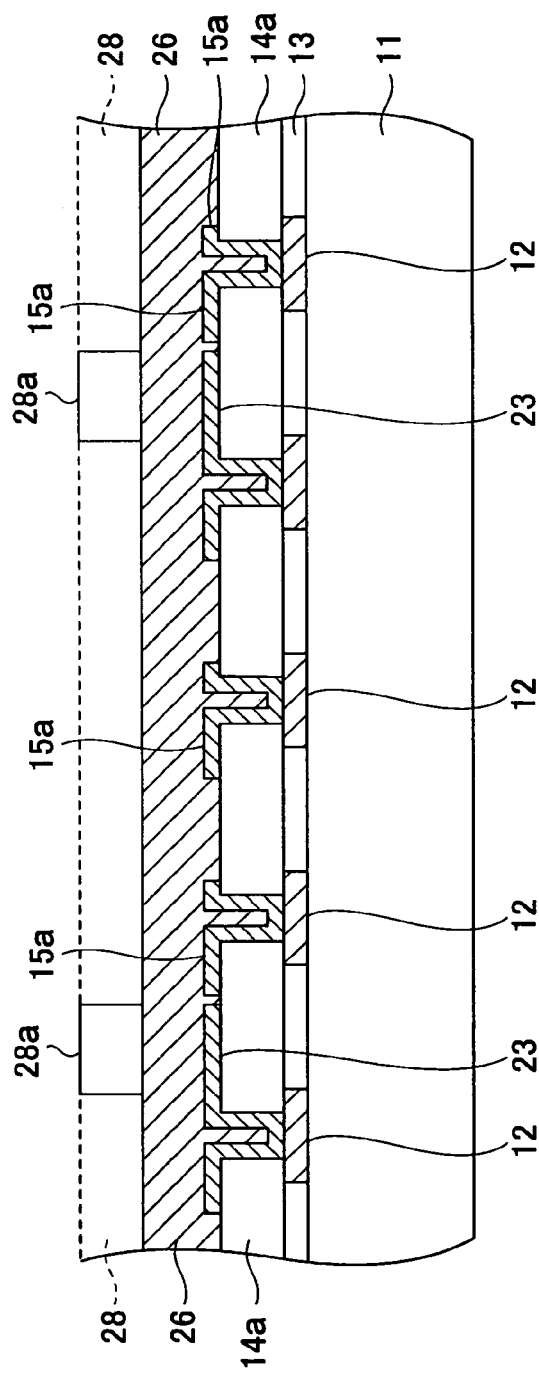

Next, in a process shown in FIG. 6C, an AD dielectric layer 26 having a thickness of 5 μm, for example, is formed on the surface of the structure obtained by the process shown in FIG. 6B, by the AD method using a dielectric particulate material.

Figure 7:
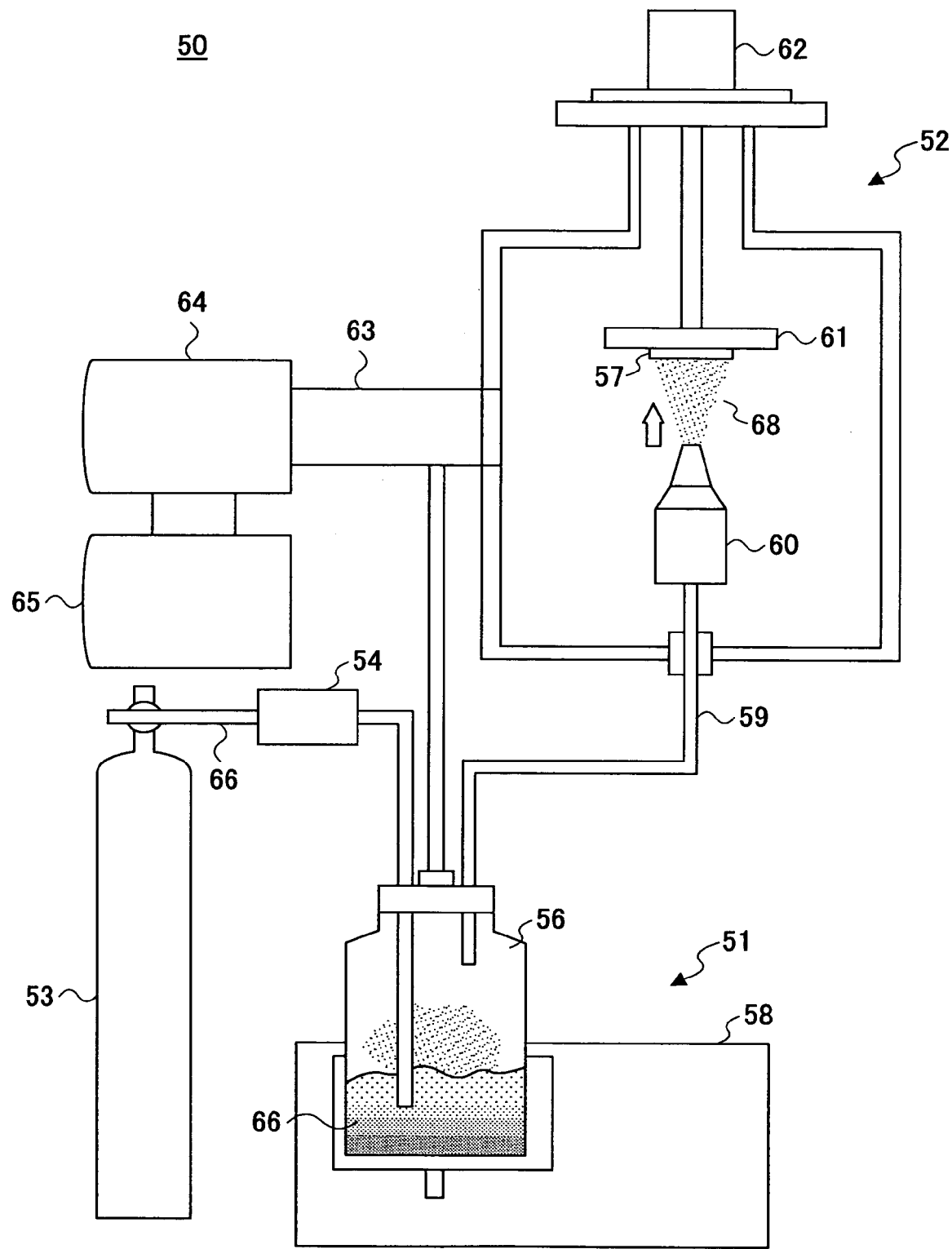
FIG. 7 is a diagram generally showing a deposition apparatus employing an AD method that is used in the present invention.

FIG. 7 is a diagram generally showing a deposition apparatus employing the AD method that is used in the present invention. An AD deposition apparatus 50 shown in FIG. 7 generally includes an aerosol generator 51 which generates an aerosol dielectric particulate material 68, and a deposition chamber 52 in which the AD dielectric layer or the like is formed on a substrate 57 by spraying the aerosol dielectric particulate material 68.

In the aerosol generator 51, a gas cylinder 53 and a mass flow controller 54 are connected via a piping 66. The mass flow controller 54 controls a gas flow rate of a high-pressure carrier gas, such as argon gas, within the gas cylinder 53. By controlling the flow rate of the carrier gas, it is possible to control the generation of dust particulates within a container 56 of the aerosol generator 51, and the spraying amount of the aerosol dielectric particulate material 68 within the deposition chamber 52. The carrier gas is not limited to argon gas, and other inert gases, such as helium gas, neon gas and nitrogen gas may be used. When using an oxide ceramic having the perovskite structure as the dielectric particulate material 68, an oxide gas such as oxygen and air may be used for the carrier gas, and it is also possible to add oxygen or air to the inert gas. The use of such carrier gases can compensate for an oxygen deficiency of the oxide ceramic dielectric particulate material when forming the AD dielectric layer.

The aerosol generator 51 is provided with a vibrator 58 which forms primary particulates of the dielectric particulate material 68 using ultrasonic vibration, electromagnetic vibration or mechanical vibration. It is possible to form a fine and continuous dielectric layer because the primary particulates of the dielectric particulate material 68 are generated by the vibrator 58.

A nozzle 60 and a substrate support 61 are provided in the deposition chamber 52. The nozzle 60 is connected to the aerosol generator 51 via a piping 59. The substrate support 61 holds the substrate 57 at a position confronting the nozzle 60. An XYZ stage 62 for controlling the position of the substrate 57 is connected to the substrate support 61. A mechanical booster 64 and a rotary pump 65 are connected to the deposition chamber 52 via a passage 63, in order to control the pressure within the deposition chamber 52 to a low pressure.

The XYZ stage 62 may move the substrate support 61 at a constant speed and/or repeatedly.

The container 56 of the aerosol generator 51 is filled with the dielectric particulate material 68 that is to form the AD dielectric layer. The gas cylinder 53 supplies, as the carrier gas, the argon gas having a pressure of 19.6 Pa to 49 Pa (2 kg/cm$^2$ to 5 kg/cm$^2$) to the deposition chamber 52, and the vibrator 58 vibrates the dielectric particulate material 68 to generate the aerosol dielectric particulate material 68. The aerosol dielectric particulates are supplied together with the carrier gas to the deposition chamber 52 via the piping 59, where the pressure within the deposition chamber 52 is set lower than the pressure within the container 56. In the deposition chamber 52 which is at room temperature, the dielectric particulates are sprayed from the nozzle 60 together with the carrier gas, and a jet flow of the dielectric particulate material 68 reaches the surface of the substrate 57 to thereby form the AD dielectric layer 26 on the wiring layer 15 as shown in FIG. 6C, for example. In this state, it is unnecessary to heat the substrate 57 on which the AD dielectric layer 26 is formed, and the substrate temperature may be drifting. The spraying velocity of the aerosol dielectric particulate material 68 may be controlled depending on the shape of the nozzle 60, the pressure of the introduced carrier gas, and the pressure difference between the container 56 and the deposition chamber 52. For example, the spraying velocity may be set in a range of 3 m/sec to 400 m/sec, and preferably in a range of 200 m/sec to 400 m/sec. By setting the spraying velocity to such a range, it is possible to increase the bonding strength between the AD dielectric layer 26 and the wiring layer 15a shown in FIG. 6C. The aerosol particulate material 68 removes the surface contamination layer and moisture on the wiring layer 15a when hitting the wiring layer 15a, and activates the surface of the wiring layer 15a. In addition, the surface of the dielectric particulate itself is similarly activated by the mutual collisions of the dielectric particulates. As a result, the dielectric particulate material 68 bonds on the surface of the wiring layer 15a and the dielectric particulates of the dielectric particulate material 68 mutually bond, thereby achieving a high bonding strength between the AD dielectric layer 26 and the wiring layer 15a, and making it possible to form a fine and continuous AD dielectric layer 26. There is a possibility of damaging the wiring layer 15 and/or the dielectric layer 14 if the spraying velocity of the aerosol dielectric particulate material 68 is greater than 400 m/sec, and it is impossible to secure a sufficient bonding strength between the AD dielectric layer 26 and the wiring layer 15 if the spraying velocity is less than 3 m/sec.

Returning now to the description of the process shown in FIG. 6C, the AD dielectric layer 26 may be formed by using an aluminum alkoxide to process the surface of a BaTiO$_3$ dielectric particulate material and carrying out a heating process to obtain an aluminum coated BaTiO$_3$ dielectric particulate material having an average grain diameter of 0.3 μm, so as to spray the aluminum coated BaTiO$_3$ dielectric particulate material by the AD method at room temperature for 5 minutes to form the AD dielectric layer 26 to a thickness of 5 μm.

In the process shown in FIG. 6C, a resist layer 28 is further formed on the surface of the AD dielectric layer 26, and this resist layer 28 is patterned to form a resist layer 28a having a pattern of the capacitor dielectric layer 22 that is to be formed by the next process.

Figure 6D:
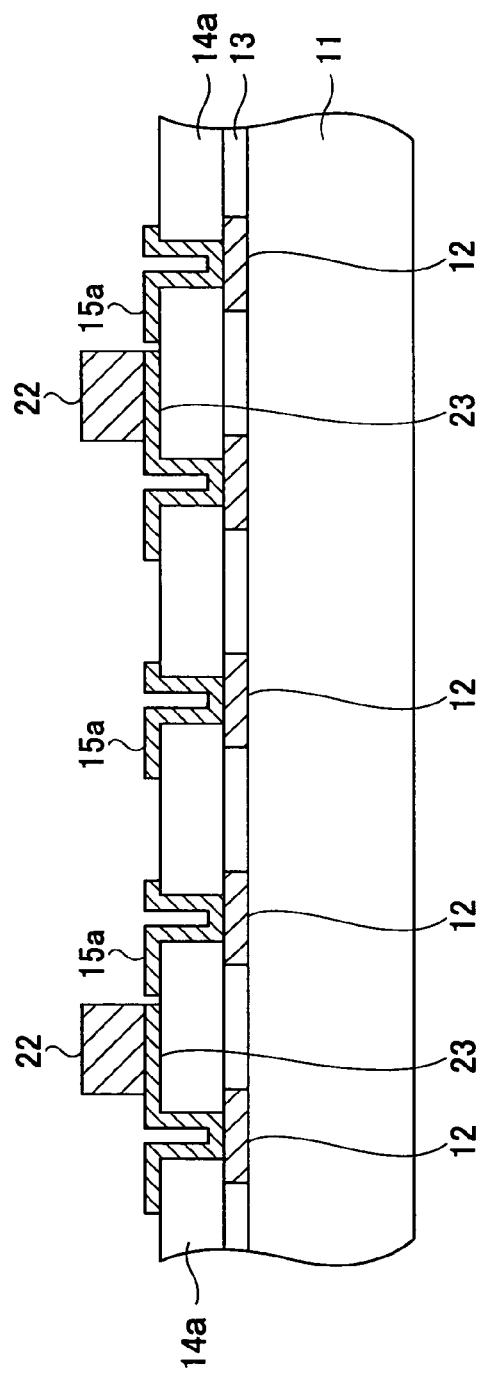

In a process shown in FIG. 6D, the resist layer 28a shown in FIG. 6C is used as a mask, and a wet etching is carried out to etch the AD dielectric layer 26 using a hydrofluoric nitrate solution as the etchant. More particularly, the AD dielectric layer 26 is dipped in a 5 wt % hydrofluoric nitrate solution at a temperature of 23° C. for approximately 15 minutes. By this wet etching, portions of the AD dielectric layer 26 other than the portions covered by the resist layer 28a are removed, and the capacitor dielectric layer 22 having each side that is 5 μm to 5000 μm, for example, is formed.

The patterning of the AD dielectric layer 26 may be carried out by the lift off method. When the lift off method is employed, a resist layer is formed on the surface of the structure shown in FIG. 6B, and openings corresponding to the pattern of the capacitor dielectric layer 22 is formed in the resist layer by the photolithography technique. The AD dielectric layer 26 is then formed to cover the patterned resist layer, similarly to the process shown in FIG. 6C, and the structure shown in FIG. 6D is obtained by dissolving and removing the resist layer.

The capacitor dielectric layer 22 may also be formed by the mask method, without using a resist layer. When the mask method is employed, the capacitor dielectric layer 22 is formed by the AD method using a mask that has openings corresponding to the pattern of the capacitor dielectric layer 22 on the surface of the structure shown in FIG. 6B.

Figure 6E:
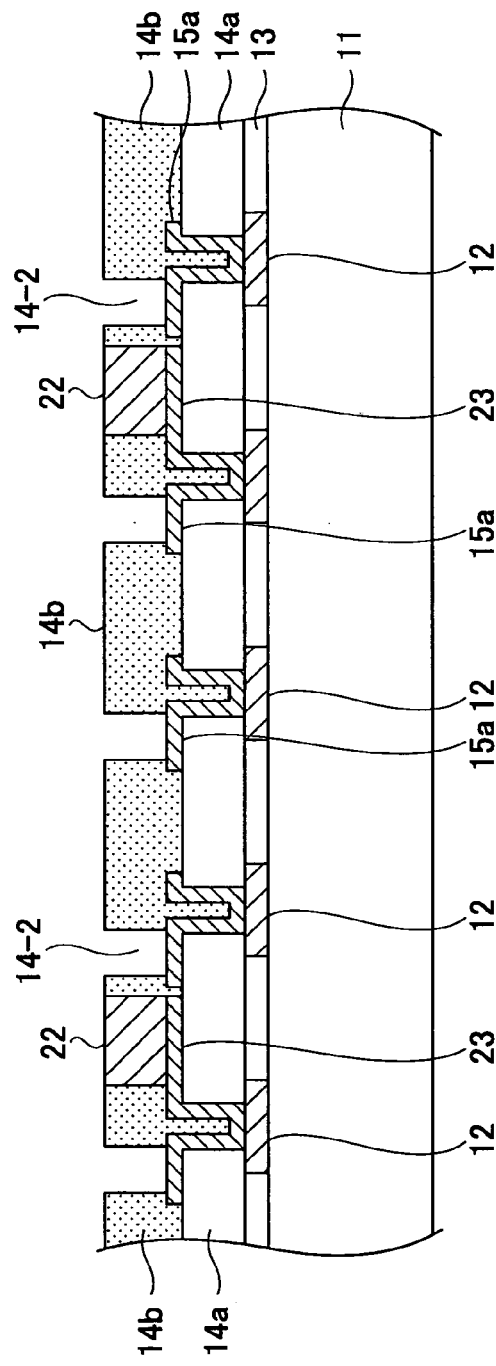

Next, in a process shown in FIG. 6E, an insulative photosensitive polyimide resin is coated on the surface of the structure shown in FIG. 6D by the spin-coating method and then dried. The insulative photosensitive polyimide resin layer is patterned to form openings 14-2 which expose the surface of the lower wiring layer 15a. Thereafter, a heating process is carried out similarly to the process shown in FIG. 6A, so as to cure the photosensitive polyimide layer and form the dielectric layer 14b.

In a case where the surface of the capacitor dielectric layer 22 is covered by the photosensitive polyimide resin layer, the surface of the photosensitive polyimide resin layer is etched by a dry etching, prior to curing or after the curing of the photosensitive polyimide resin layer, so as to expose the surface of the capacitor dielectric layer 22.

Figure 6F:
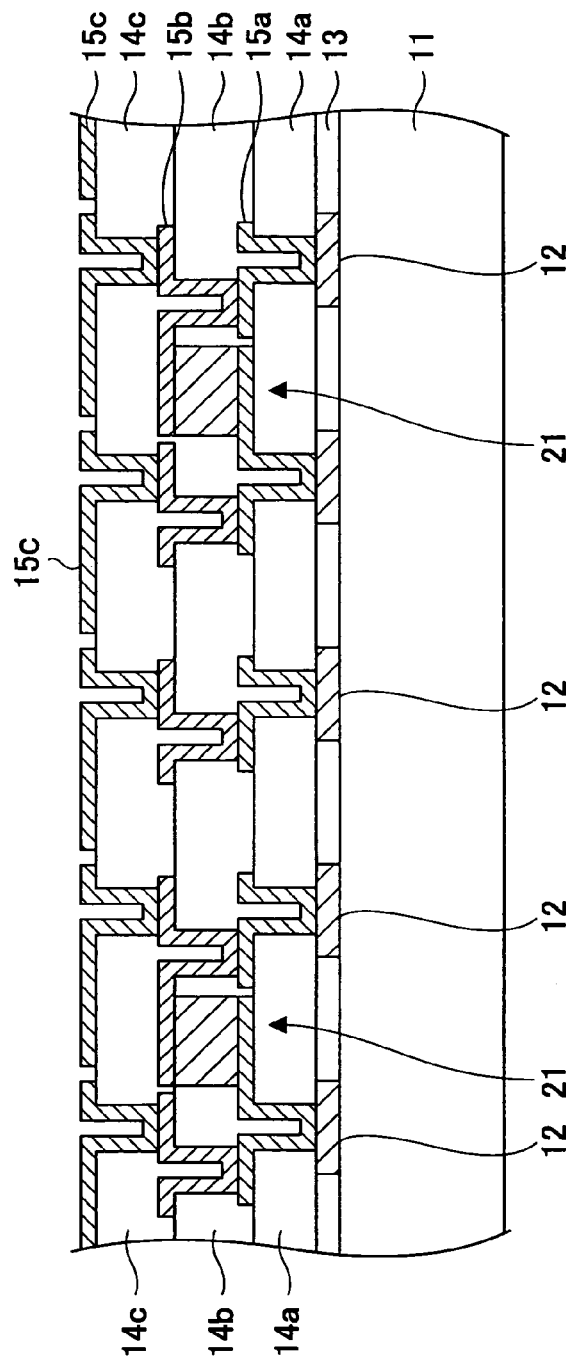

Next, in a process shown in FIG. 6F, a plated seed layer made of Cu is sputtered on the surface of the structure shown in FIG. 6E, and a Cu plated layer having a thickness of 5 μm, for example, is electroplated on the entire surface of the plated seed layer, similarly to the process shown in FIG. 6B.

Moreover, in the process shown in FIG. 6F, a resist layer (not shown) is formed on the surface of the Cu plated layer (not shown), and a wiring pattern of the wiring layer 15b is formed on the resist layer. A wet etching is then carried out to etch the Cu plated layer and the plated seed layer, so as to form the wiring layer 15b. The upper electrodes 24 of the decoupling capacitor 21 are formed simultaneously as the wiring layer 15b.

Furthermore, in the process shown in FIG. 6F, the dielectric layer 14c and the wiring layer 15c are formed by processes respectively similar to the process of forming the dielectric layer 14b shown in FIG. 6E and the process of forming the wiring layer 15a shown in FIG. 6B.

After the process shown in FIG. 6F, the electrode pads 18 shown in FIG. 4, made up of a Cu layer and an Au layer, are formed on the wiring layer 15c, and the encapsulating resin layer 20 is formed to cover the wiring layer 15c and fill the gaps between the electrode pads 18. For example, the encapsulating resin layer 20 is formed by arranging an epoxy encapsulating resin on the surface of the structure having the electrode pads 18, and melting the epoxy encapsulating resin by a metal mold that is heated to a temperature of 175° C., for example, so as to heat and press against the epoxy encapsulating resin and spread the epoxy encapsulating resin over the entire surface of the structure. The metal mold is removed from the surface of the structure after the epoxy encapsulating resin cures. A dicing process is carried out to cut the structure into semiconductor chips, and the solder bumps 19 are provided to form the semiconductor device 10 shown in FIG. 4.

According to this embodiment of the method of producing the semiconductor device, the AD dielectric layer 26 which forms the capacitor dielectric layer 22 is formed at room temperature. For this reason, it is possible to avoid thermal damage which would otherwise occur if the semiconductor chip 11 or the dielectric layer 14a made of the resin material is heated. In addition, although the conventional low-temperature process such as the sputtering and the sol-gel method require a thermal process at a temperature exceeding 400° C. after the capacitor dielectric layer is formed in order to increase the permittivity, this embodiment of the method uses the AD method and it is possible to form the capacitor dielectric layer 22 having a high permittivity by a process that is carried out at a lower temperature.

Figure 8:
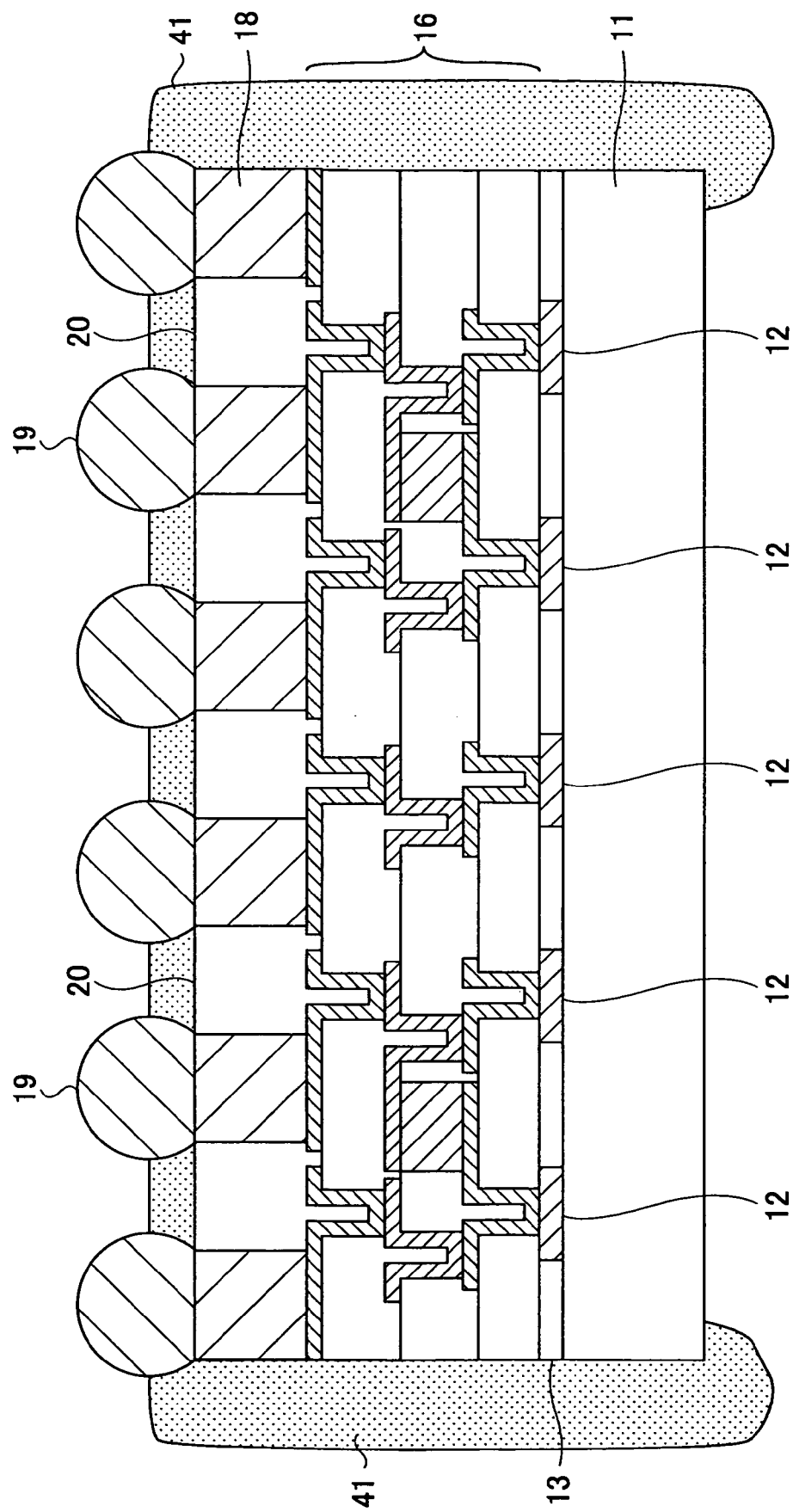
FIG. 8 is a cross sectional view showing an important part of a modification of the first embodiment of the semiconductor device.

FIG. 8 is a cross sectional view showing an important part of a modification of the first embodiment of the semiconductor device. In FIG. 8, those parts which are the same as those corresponding parts in FIG. 4 are designated by the same reference numerals, and a description thereof will be omitted.

In a semiconductor device 40 shown in FIG. 8, an encapsulating resin layer 41 covers the entire side surfaces of the stacked wiring structure 16 and the semiconductor chip 11. Otherwise, the semiconductor device 40 has a structure similar to that of the semiconductor device 10 shown in FIG. 4.

The encapsulating resin layer 41 is made of a vapor or moisture resistant polyimide resin that is similar to that used for the encapsulating resin layer 20 of the first embodiment of the semiconductor device. By covering the surface and the side surfaces of the stacked wiring structure 16, it is possible to prevent moisture from entering the capacitor dielectric layer 22 and prevent deterioration of the capacitor dielectric layer 22 that is formed by the AD method. Furthermore, it is possible to prevent the moisture from entering the semiconductor chip 11.

A chip-in-size-package having the decoupling capacitor 21 that is formed by the AD method using $BaTiO_3$ dielectric particulate material for the capacitor dielectric layer 22, was formed as a first embodiment sample Emb1-1. The capacitor dielectric layer 22 was formed to a thickness of 10 μm using the $BaTiO_3$ dielectric particulate material having an average grain diameter of 0.3 μm, by spraying the $BaTiO_3$ dielectric particulate material at a spraying velocity of 200 m/sec for 15 minutes at room temperature using the AD method. The relative permittivity of the decoupling capacitor 21 was 1500 at 1 GHz, and the capacitor resonance frequency was 4 GHz. The wiring inductance was 30 pH.

Another first embodiment sample Emb1-2 was formed using $BaSrTiO_3$ dielectric particulate material having an average grain diameter of 0.3 μm in place of the $BaTiO_3$ dielectric particulate material. The capacitor dielectric layer 22 was formed to a thickness of 5 μm using the $BaSrTiO_3$ dielectric particulate material having the average grain diameter of 0.3 μm, by spraying the $BaSrTiO_3$ dielectric particulate material at a spraying velocity of 200 m/sec for 15 minutes at room temperature using the AD method. The relative permittivity of the decoupling capacitor 21 was 3000 at 1 GHz, and the capacitor resonance frequency was 5 GHz. The wiring inductance was 10 pH.

The relative permittivities of the first embodiment samples Emb1-1 and Emb1-2 were measured by applying a high-frequency voltage of 1 GHz to the decoupling capacitor 21.

[Second Embodiment]

Figure 9:
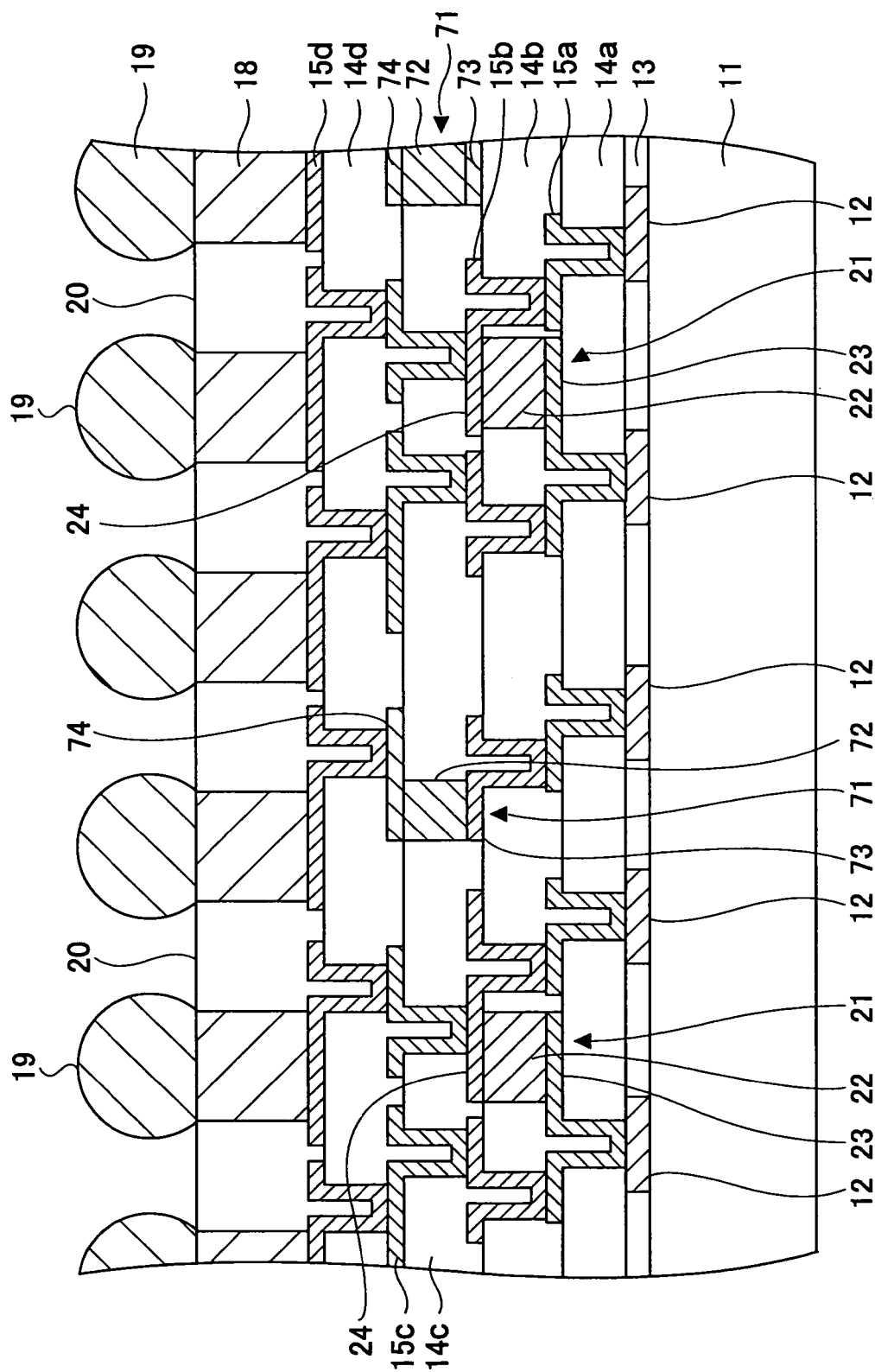
FIG. 9 is a cross sectional view showing an important part of a second embodiment of the semiconductor device according to the present invention.

FIG. 9 is a cross sectional view showing an important part of a second embodiment of the semiconductor device according to the present invention. In FIG. 9, those parts which are the same as those corresponding parts in FIG. 4 are designated by the same reference numerals, and a description thereof will be omitted.

A semiconductor device 70 shown in FIG. 9 includes a semiconductor chip 11, connecting electrodes 12 and a protection layer 13 provided on a surface of the semiconductor chip 11, a stacked wiring structure 16 covering the surface of the connecting electrodes 12 and the protection layer 13, electrode pads 18 and solder bumps 19 formed as external terminals on a surface of the stacked wiring structure 16, and an encapsulating resin layer 20 covering the surface of the stacked wiring structure 16. The stacked wiring structure 16 is made up of alternately stacked dielectric layers 14 and wiring layers 15. In the case shown in FIG. 9, the stacked wiring structure 16 includes 4 dielectric layers 14a, 14b, 14c and 14d, and 4 wiring layers 15a, 15b, 15c and 15d.

Decoupling capacitors 21 and damping resistor elements 71 are provided within the stacked wiring structure 16. Other than the damping resistor elements 71 that are provided in addition to the decoupling capacitors 21, the semiconductor device 70 is basically the same as the semiconductor device 10 shown in FIG. 4.

The damping resistor element 71 is made up of an upper electrode 74 and a lower electrode 73 which sandwich a resistor layer 72. The upper electrode 74 and the lower electrode 73 are formed by extending portions of the wiring layers 15c and 15b. As shown in FIG. 9, it is preferable that the upper and lower electrodes 74 and 73 respectively form approximately the same plane as in-plane wirings of the corresponding wiring layers 15c and 15b provided on the respective dielectric layers 14c and 14b. The upper and lower electrodes 74 and 73 are electrically connected to signal lines. The lower electrode 73 is electrically connected to the connecting electrodes 12 of the semiconductor chip 11 via the wiring layers 15a and 15b. The upper electrode 74 is connected to the electrode pads 18 via the wiring layers 15c and 15d.

The resistor layer 72 is formed by spraying an aerosol resistor particulate material on the surfaces of the dielectric layer 14b, the wiring layer 15b and the lower electrode 73 using the AD method. For example, one element or a mixture of two or more elements is preferably selected from $RuO_2$, $ReO_2$, $IrO_2$, $SrVO_3$, $CaVO_3$, $LaTiO_3$, $SrMoO_3$, $CaMoO_3$, $SrCrO_3$, $CaCrO_3$, $LaVO_3$, $GdVO_3$, $SrMnO_3$, $CaMnO_3$, Ni—Cr—O, $BiCrO_3$, $LaCrO_3$, $LnCrO_3$, $SrRuO_3$, $CaRuO_3$, $SrFeO_3$, $BaRuO_3$, $LaMnO_3$, $LnMnO_3$, $LaFeO_3$, $LnFeO_3$, $LaCoO_3$, $LaRhO_3$, $LaNiO_3$, $PbRuO_3$, $Bi_2Ru_2O_7$, $LaTaO_3$, $BiRuO_3$ and $LaB_6$ and used for the resistor particulate material.

The resistor particulate material may have an aluminum compound which functions as a binder formed on the surface of the resistor particulates. The aluminum compound that may be used in this case are the same as the aluminum compounds usable for the dielectric particulates of the dielectric particulate material of the first embodiment of the semiconductor device described above, and a description thereof will be omitted.

Similarly to the reasons for the dielectric particulate material, the average grain diameter of the resistor particulate material is preferably set in a range of 10 nm to 10 μm/

According to this embodiment of the semiconductor device, the damping resistor elements 71 can be provided adjacent to the semiconductor chip 11 so as to achieve an impedance matching and realize a high-speed data transfer. In addition to the damping resistor elements 71, it is of course possible to provide between the signal line and the ground line a terminating resistor element that is made of the resistor particulate material formed by the AD method.

Figure 10A:
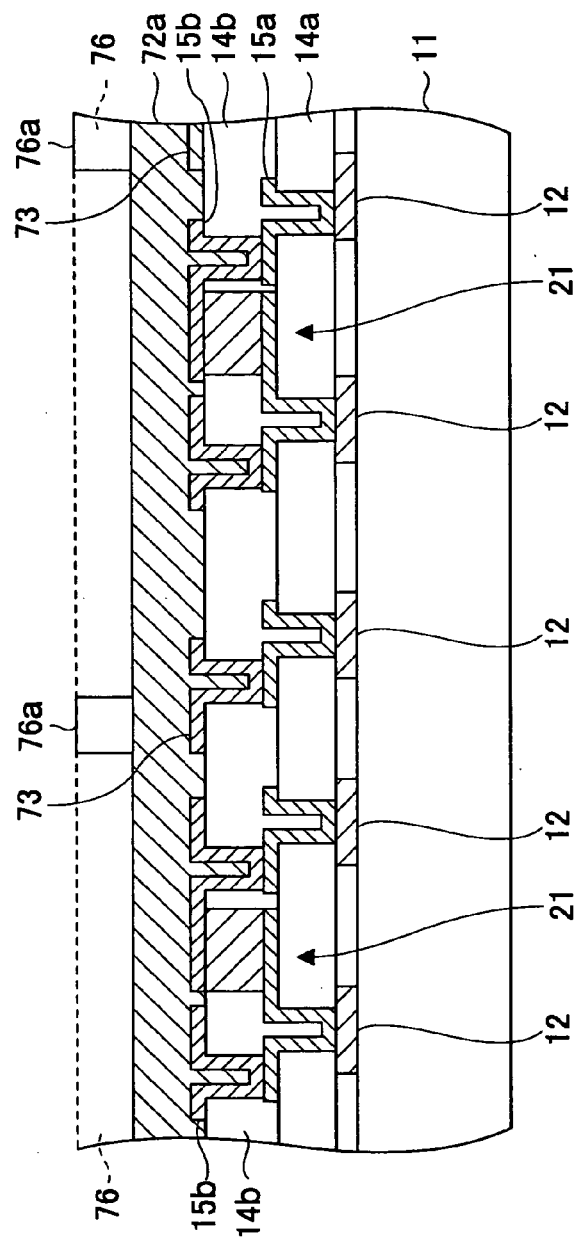
FIGS. 10A and 10B are cross sectional views for explaining a second embodiment of the method of producing the semiconductor device according to the present invention.
Figure 10B:
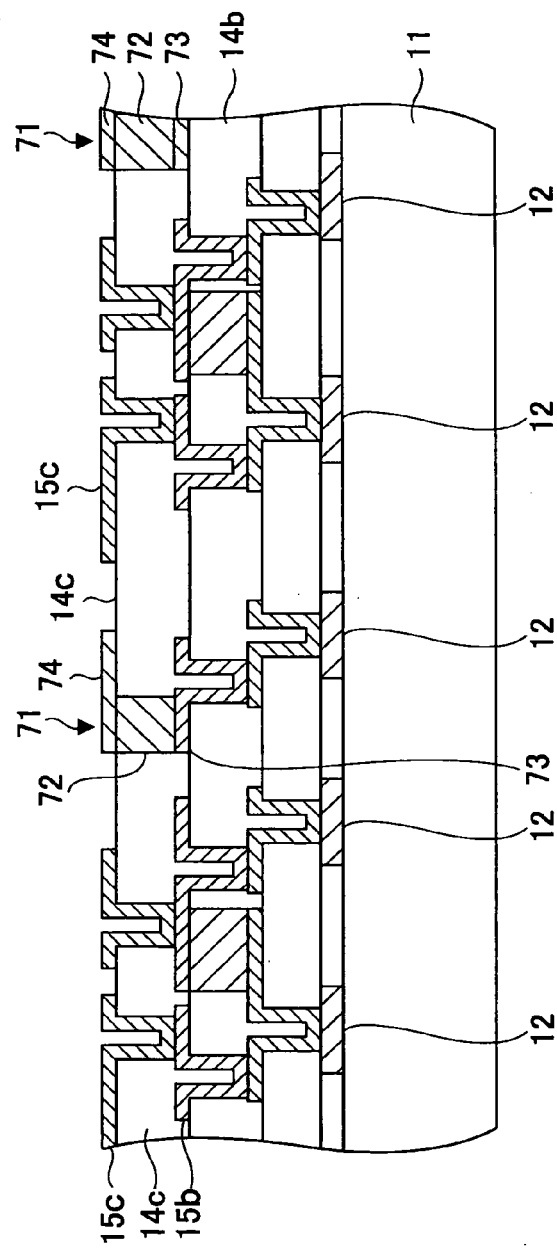

FIGS. 10A and 10B are cross sectional views for explaining a second embodiment of the method of producing the semiconductor device according to the present invention. A description will be given of the method of producing the semiconductor device 70 described above, by referring to FIGS. 10A and 10B.

In a process shown in FIG. 10A, the structure up to the wiring layer 15*b* and including the upper electrodes 74 of the decoupling capacitors 21 are formed similarly to the processes of the first embodiment of the method described above in conjunction with FIGS. 6A through 6F.

In the process shown in FIG. 10A, an AD resistor layer 72*a* made of the resistor particulate material described above is formed on the surfaces of the wiring layer 15*b* and the dielectric layer 14*b* by the AD method. For example, the AD resistor layer 72*a* is formed to a thickness of 5 μm in 30 minutes by the AD method using the $BiRuO_3$ resistor particulate material having an average grain diameter of 0.01 μm.

In the process shown in FIG. 10A, the surface of the AD resistor layer 72*a* is further planarized by a Chemical Mechanical Polishing (CMP). Then, a resist layer 76 is formed on the planarized surface of the AD resistor layer 72*a*, and the resist layer 76 is patterned into a resist layer 76*a* having a pattern of the resistor layer 72 that is to be formed.

Next, in a process shown in FIG. 10B, the resist layer 76*a* shown in FIG. 10A is used as a mask, and the AD resistor layer 72*a* is etched by a wet etching using a hydrofluoric nitrate solution as the etchant. More particularly, the AD resistor layer 72*a* is dipped in a 5 wt % hydrofluoric nitrate solution at a temperature of 23° C. for approximately 20 minutes. By this wet etching, portions of the AD resistor layer 72*a* other than the portions covered by the resist layer 76*a* are removed, and the resistor layer 72 having each side that is 5 μm to 2000 μm, for example, is formed.

In the process shown in FIG. 10B, the dielectric layer 14*c* and the wiring layer 15*c* including the upper electrodes 74 are further formed on the surface of the structure formed with the resistor layer 72, similarly to the process of the first embodiment of the method described above in conjunction with FIG. 6E.

After the process shown in FIG. 10B, the dielectric layer 14*d*, the wiring layer 15*d*, the electrode pads 18, the encapsulating resin 20 and the solder bumps 19 are successively formed on the structure, similarly to the process of the first embodiment of the method described above in conjunction with FIG. 6F.

According to this embodiment of the method of producing the semiconductor device, the resistor layer 72 can be formed at room temperature by the AD method, in addition to the capacitor dielectric layer 22. Consequently, it is possible to prevent thermal damage to the semiconductor chip 11 and the dielectric layer 14 that is made of a resin.

Figure 11:
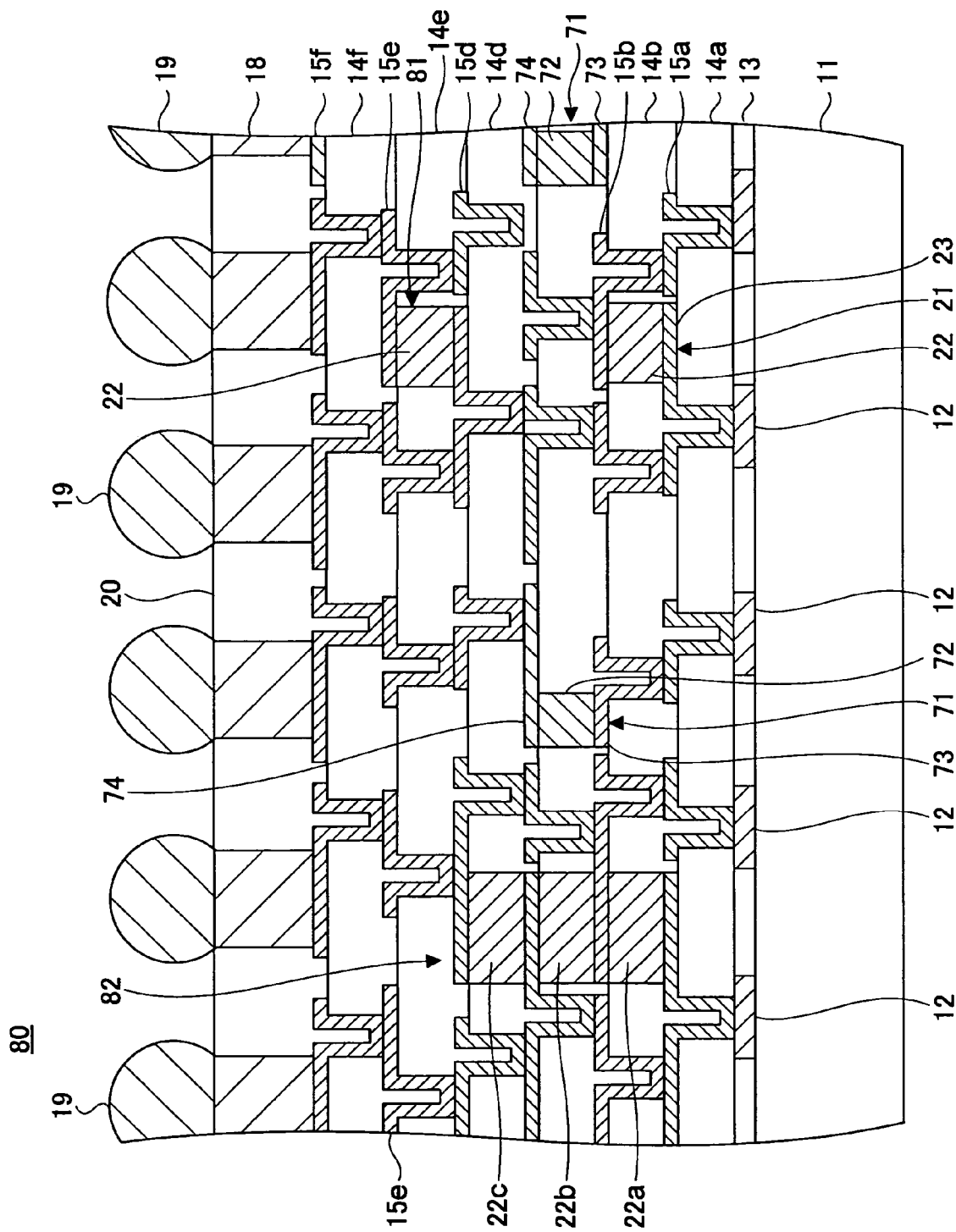
FIG. 11 is a cross sectional view showing an important part of a first modification of the second embodiment of the semiconductor device.

FIG. 11 is a cross sectional view showing an important part of a first modification of the second embodiment of the semiconductor device. In FIG. 11, those parts which are the same as those corresponding parts in FIG. 9 are designated by the same reference numerals, and a description thereof will be omitted.

In this first modification of the second embodiment of the semiconductor device, a semiconductor device 80 shown in FIG. 11 is additionally provided with decoupling capacitors 81 and 82 and dielectric layers 14*e* and 14*f*. Otherwise, the structure of the semiconductor device 80 is basically the same as that of the semiconductor device 70 shown in FIG. 9.

The decoupling capacitor 81 is made up of an upper electrode formed by the wiring layer 15*e* and a lower electrode formed by the wiring layer 15*d* which sandwich the capacitor dielectric layer 22. The decoupling capacitor 81 has a structure similar to that of the decoupling capacitor 21, and may be formed by processes similar to those used to form the decoupling capacitor 21. Accordingly, a description of the processes of forming the decoupling capacitor 81 will be omitted.

The decoupling capacitor 82 is made up of electrodes formed by the wiring layers 15*a* through 15*d* that are connected to the respective power lines and connection lines, and capacitor dielectric layers 22*a* through 22*c* that are respectively sandwiched between two of these electrodes. Since the decoupling capacitor 82 is formed by a plurality of capacitors that are connected in parallel, the decoupling capacitor 82 may have a large electrostatic capacitance.

According to this first modification, the decoupling capacitors 21, 81 and 82 may be provided in a plurality of dielectric layers 14, by forming the capacitor dielectric layer 22 by the AD method. In addition, by alternately stacking the capacitor dielectric layers 22*a* through 22*c* and the electrodes respectively formed by the wiring layers 15*a* through 15*d*, it is possible to form decoupling capacitor having various electrostatic capacitances.

Next, a description will be given of a second modification of the second embodiment of the semiconductor device. This second modification is provided with an inductor element within the second embodiment of the semiconductor device shown in FIG. 9.

Figure 12:
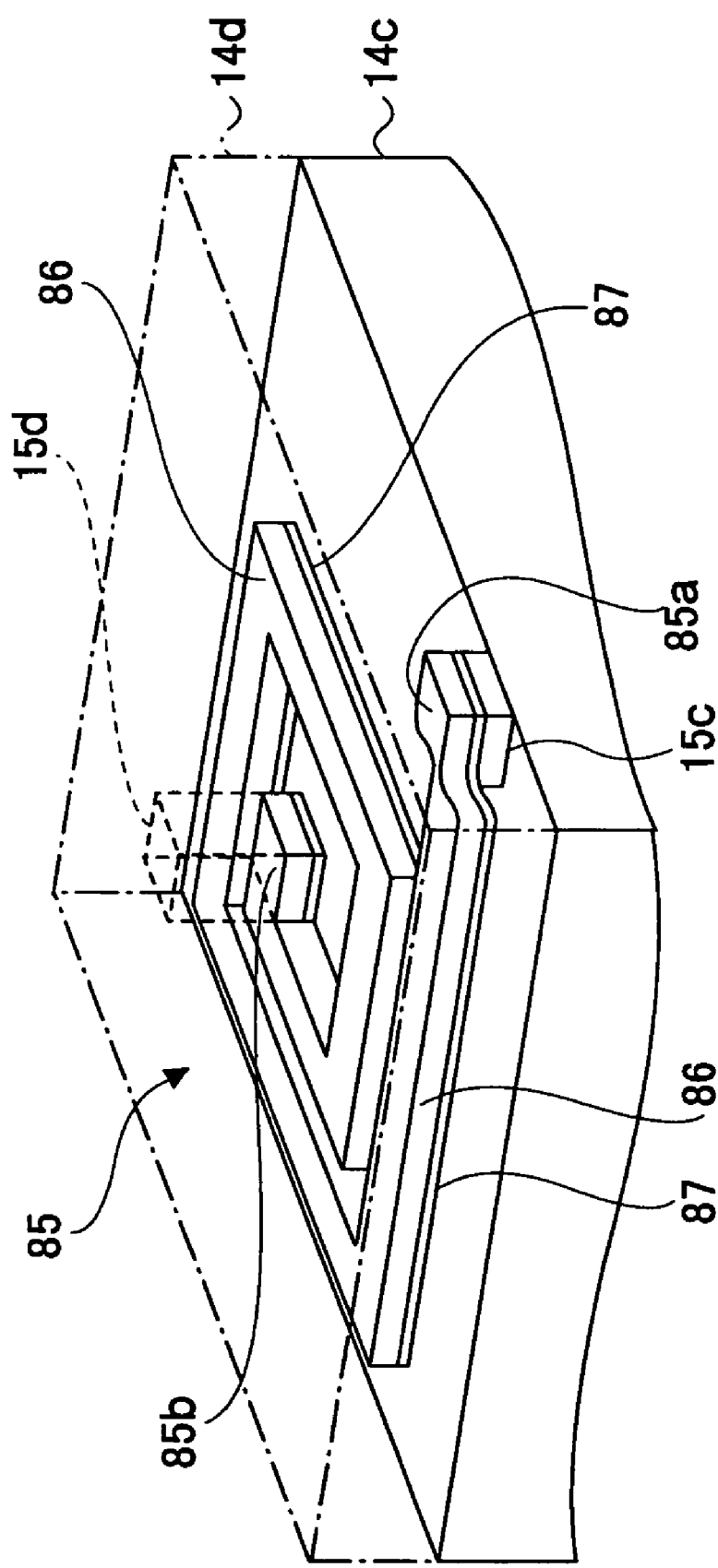
FIG. 12 is a disassembled perspective view showing an important part of a second modification of the second embodiment of the semiconductor device.

FIG. 12 is a disassembled perspective view showing an important part of this second modification of the second embodiment of the semiconductor device. For the sake of convenience, FIG. 12 shows the inductor element on an enlarged scale.

An inductor element 85 shown in FIG. 12 is made up of a spiral conductor layer 86 formed on the dielectric layer 14*c*, and is covered by the dielectric layer 14*d*. One end 85*a* of the inductor element 85 is electrically connected to the wiring layer 15*c*, and the other end 85*b* of the inductor element 85 is electrically connected to a via of the wiring layer 15*d*. The inductor element 85 has a thickness of 50 nm to 50 μm, a line width of 5 μm to 500 μm, a size of 40000 μm$^2$ to 1 mm$^2$, and has an inductance of 1 μH to 100 μH, for example.

The conductor layer 86 of the inductor element 85 is formed using the AD method by spraying an aerosol conductor particulate material on the surface of the dielectric layer 14*c*. The conductor particulate material may be a metal material that includes an element or an alloy of two or more elements selected from Cu, Ag, Au, Pt, Pd and Al. The conductor particulate material has an average grain diameter set in a range of 10 nm to 1 μm. Further, similarly as in the case of the first embodiment of the semiconductor device, an aluminum compound may be added to the conductor particulate material, and the conductor particulates may be coated with or covered by the aluminum compound. A carrier gas may be selected from inert gases such as argon gas, helium gas, neon gas and nitrogen gas. It is also possible to use as the carrier gas a reducible gas such as a mixture gas having hydrogen added to an inert gas. Such carrier gases prevent oxidation of the conductor particulate material, and prevent the specific resistance of the deposited conductor layer 86 from increasing.

The inductor element 85 is formed by patterning a resist layer that is formed on the dielectric layer 14*c*, depositing the conductor particulate material by the AD method so as to cover the patterned resist layer, similarly as in the case of the first embodiment of the method, and removing the patterned resist layer by a lift off method. As a result, it is possible to easily form the inductor element 85 adjacent to the semiconductor chip 11 by using the AD method.

In a case where the semiconductor chip 11 uses a plurality of power supply voltages with respect to the supply of one power supply voltage, it is necessary to internally provide a step-down circuit. When forming, as the step-down circuit, a DC-DC converter by a combination of a pulse width modulation circuit and an integration circuit, the integration circuit formed by a combination of the inductor element 85 and a capacitor element may be provided outside the semiconductor chip 11, and a pulse signal supplied from the pulse width modulation circuit within the semiconductor chip 11 may be converted into a DC signal by the integration circuit. The integration circuit may be formed by the inductor element 85 and a capacitor element that is formed similarly to the decoupling capacitor 21. By providing such a DC-DC converter, it is possible to reduce the size of the semiconductor device that uses a plurality of power supply voltages with respect to the supply of one power supply voltage.

In addition, a smoothing circuit used for a converter circuit that converts an AC power supply voltage to a DC power supply voltage may be formed by a combination of the capacitor of the second embodiment and the inductor element of this modification of the semiconductor device, for example. In this case, it is possible to obtain a DC power supply voltage that is substantially suppressed of ripples and includes small current deviations.

A contiguously contacting layer 87 made of an element or an alloy including at least one element selected from copper, titanium and nickel, may be provided between the dielectric layer 14c and the conductor layer 86. For example, the contiguously contacting layer 87 may be formed by sputtering. The contiguously contacting layer 87 improves the bonding, that is, the contiguous contact, between the dielectric layer 14c and the conductor layer 86 that is formed by the AD method. Of course, it is possible to form a meander inductor element similarly to the spiral inductor element. It is also possible to form antenna elements such as a monopole antenna and a inverted F-type antenna, similarly to the inductor element. Moreover, it is possible to form a filter by combining the capacitor element, the resistor element and the inductor element described heretofore.

[Third Embodiment]

Figure 13:
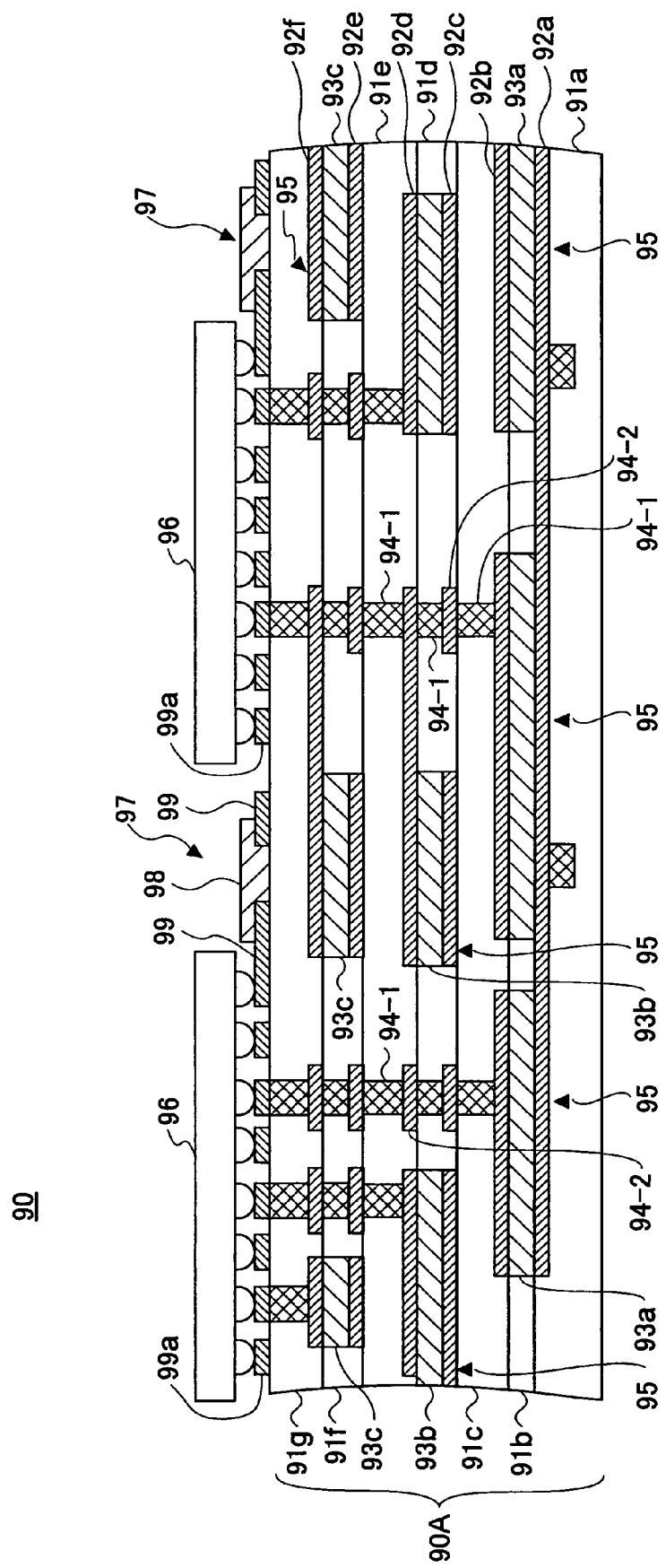
FIG. 13 is a cross sectional view showing an important part of an electronic apparatus having a third embodiment of the semiconductor device according to the present invention.

FIG. 13 is a cross sectional view showing an important part of an electronic apparatus having a third embodiment of the semiconductor device according to the present invention.

An electronic apparatus 90 shown in FIG. 13 generally includes a circuit board (or substrate) 90A, and a semiconductor chip 96 formed on a surface of the circuit board 90A. The circuit board 90A includes dielectric layers 91a through 91g and wiring layers 92a through 92f that are alternately stacked, vias 94-1 and pads 94-2 that electrically connect the wiring layers 92a through 92f and electrically connect electrode pads 99a and the wiring layers 92a through 92f.

Capacitor elements 95 such as decoupling capacitors, and resistor elements 97 are formed on the circuit board 90A. The capacitor elements 95 have capacitor dielectric layers 93a through 93c which may be provided in the same layer as any one of dielectric layers 91a through 91g. The resistor elements 97 are formed on the surface of the circuit board 90A.

For example, the dielectric layers 91a through 91g are made of a resin material having a low permittivity, such as a bis maleimide triazine resin, a maleimide styryl resin and a polyimide resin. The bis maleimide triazine resin and the maleimide styryl resin are particularly suited for use as the dielectric layers 91a through 91g because the permittivity and the dielectric loss are low even at high frequencies, thereby enabling a circuit having a high data transfer (or transmission) speed to be formed.

The dielectric layers 91a through 91g may be formed by coating a layer of a precursor solution of the dielectric material, drying at a temperature of 80° C., and thereafter curing the layer at a temperature of 350° C. The wiring layers 92a through 92f are formed on the corresponding dielectric layers 91a through 91g by processes similar to those of the first embodiment of the method described above, so that the dielectric layers 91a through 91g and the wiring layers 92a through 92f are alternately stacked as shown in FIG. 13. The lowermost dielectric layer 91a may be formed on a surface of a processing substrate made of Pyrex glass (registered trademark), for example. Each of the dielectric layers 91a through 91g may be formed by the spin-coating method, the screen printing method, the spraying method, the curtain coating method, the roll coating method and the dipping method. Further, the surface of one or more dielectric layers 91a through 91g may be polished and planarized by the CMP method.

The capacitor element 95 is made up of one of the capacitor dielectric layers 93a through 93c that are formed by the AD method similarly to the first or second embodiment of the method described above, and upper and lower electrodes which sandwich the one of the capacitor dielectric layers 93a through 93c and are formed by two corresponding ones of the wiring layers 92a through 92f. Because the capacitor dielectric layers 93a through 93c are formed by the AD method, the dielectric layers 91a through 91g may be formed by a resin material, the capacitor dielectric layers 93a through 93c can be provided in a plurality of dielectric layers 91a through 91g. In addition, since it is possible to obtain the capacitor dielectric layers 93a through 93c having a high permittivity when formed by the AD method, it is possible to provide capacitor elements 95 having various electrostatic capacitances, particularly decoupling capacitors adjacent to the semiconductor chip 96.

The capacitor dielectric layers 93a through 93c may be formed by a dielectric particulate material, similarly to the first or second embodiment of the method described above, and a description thereof will be omitted. In addition, since regions other than the regions where the capacitor elements 95 are formed are filled by the corresponding dielectric layers 91a through 91g having the low permittivity, it is possible to suppress the signal delay caused by the capacitor dielectric layers 93a through 93c by arranging the capacitor elements 95 at locations separated from the signal lines such as electrodes 99.

The resistor element 97 is made up of a resistor layer 98 and the electrodes formed on both sides of the resistor layer 98. The resistor element 97 may be formed similarly to the resistor element of the second embodiment of the semiconductor device, and a description thereof will be omitted. The location of the resistor element 97 is not limited to the surface of the circuit board 90A, and may be provided within any of the dielectric layers 91a through 91g.

In the electronic apparatus 90 having the circuit board 90A of this embodiment, the capacitor elements 95 such as the decoupling capacitors and the resistor elements 97 such as the damping resistor element are provided adjacent to the semiconductor chip 96. For this reason, it is possible to suppress the signal delay and achieve an impedance matching. Particularly because the capacitor dielectric layers 93a through 93c are formed by the AD method, the permittivities of the capacitor dielectric layers 93a through 93c are high, and it is possible to provide the capacitor elements 95 having various electrostatic capacitances in a plurality of layers (that is, the dielectric layers 91a through 91g). Consequently, it is possible to improve the effects of the decoupling capacitor, and the electronic apparatus 90 can realize a high-speed data transfer. Furthermore, since each of the capacitor dielectric layers 93a through 93c is selectively provided within one layer, and other regions of this one layer is filled by a corresponding one of the dielectric layers 91a through 91g that are made of a resin having a low permittivity such as the bis maleimide triazine resin or the maleimide styryl resin, it is possible to suppress the wiring delay.

[Fourth Embodiment]

Figure 14:
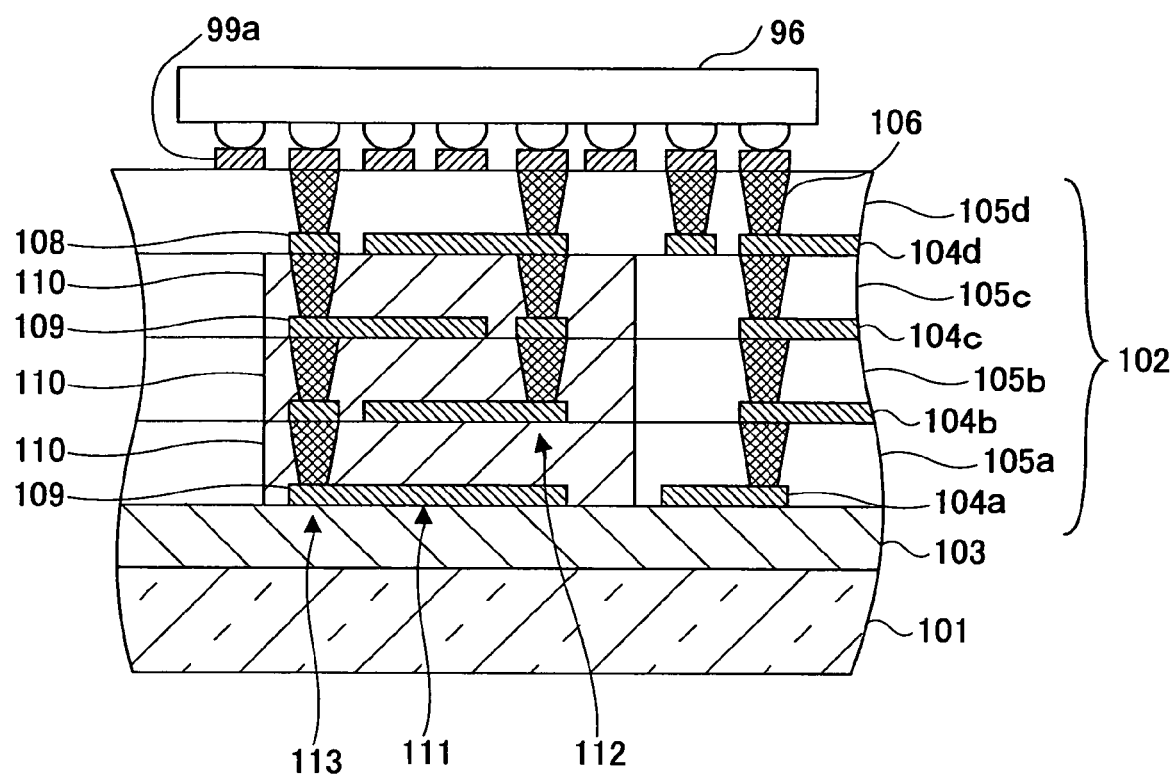
FIG. 14 is a cross sectional view showing an important part of an electronic apparatus having a fourth embodiment of the semiconductor device according to the present invention.

FIG. 14 is a cross sectional view showing an important part of an electronic apparatus having a fourth embodiment of the semiconductor device according to the present invention.

An electronic apparatus 100 shown in FIG. 14 generally includes a substrate 101, a multi-layer wiring (or multi-level interconnection) layer 102, and a semiconductor chip 96 provided on a surface of the multi-layer wiring layer 102. The multi-layer wiring layer 102 is made up of a barrier layer 103 covering the substrate 101, and wiring layers 104a through 104d and dielectric layers 105a through 105d that are alternately stacked on the barrier layer 103. The wiring layers 104a through 104d are electrically connected via vias 106 and pads 108.

The substrate 101 may be made of a suitable resin material such as epoxy resin, polyimide resin, polyester resin and Teflon (registered trademark). In addition, a glass epoxy substrate having a glass cloth impregnated by a denatured epoxy resin, and a glass epoxy substrate including a bis maleimide triazine resin or a maleimide styryl resin may be used for the substrate 101.

A multi-layer decoupling capacitor 111 made up of alternately stacked electrodes 109 and capacitor dielectric layers 110 is provided on the multi-layer wiring layer 102. In the decoupling capacitor 111, each capacitor dielectric layer 110 is sandwiched between 2 electrodes 109 that are respectively electrically connected to a power supply line 112 and a ground line 113, and such a capacitor structure made up of one capacitor dielectric layer 110 and 2 electrodes 109 are stacked. Such capacitor structures are connected in parallel between the power supply line 112 and the ground line 113, to thereby realize a large electrostatic capacitance.

In the decoupling capacitor 111, one electrode 109 is formed on the surface of the barrier layer 103, and one capacitor dielectric layer 110 is formed by the AD method so as to cover the surface of the barrier layer 103 and the electrode 109. In a case where the substrate 101 is made of a composite material of glass cloth and a resin, such as a glass epoxy resin substrate, if the capacitor dielectric layer 110 is formed directly on the surface of the substrate 101 by the AD method, a difference is introduced between the growth rate of the capacitor dielectric layer 110 on the region of the substrate surface having the glass cloth and the growth rate of the capacitor dielectric layer 110 on the region of the substrate surface having the resin. In this case, the planar properties of the surface of the capacitor dielectric layer 110 may deteriorate, but the provision of the barrier layer 103 on the substrate surface prevents such a deterioration of the planar properties of the capacitor dielectric layer 110.

The barrier layer 103 may be made of a suitable dielectric material such as a bis maleimide triazine resin, a maleimide styryl resin, and a polyimide resin having a low permittivity. In addition, the barrier layer 103 may have a stacked structure made up of a Cu layer covering the surface of the substrate 101 and a dielectric layer stacked on the Cu layer. In this case, a ground surface having a large area can be obtained by connecting the Cu layer to the ground line.

The capacitor dielectric layer 110 may be made of a material similar to those used in the first and second embodiments of the semiconductor device described above, and formed by the AD method. The wiring layers 104a through 104d and the dielectric layers 105a through 105 may be made of materials similar to those used in the third embodiment of the semiconductor device described above, and formed by methods similar to those used to form the corresponding layers of the third embodiment of the semiconductor device.

Resistor elements similar to the resistor element 97 of the third embodiment of the semiconductor device may be additionally provided on the multi-layer wiring layer 102.

According to this fourth embodiment of the semiconductor device, it is possible to provide the decoupling capacitor 111, that has a large electrostatic capacitance, adjacent to the semiconductor chip 96. Hence, it is possible to suppress the signal delay.

Therefore, the present invention can easily form a passive element, such as a capacitor element, resistor element, inductor element and antenna element, that are suitable for use in a semiconductor device.

Further, the present invention is not limited to these embodiments, but various variations and modifications may be made without departing from the scope of the present invention.

What is claimed is:

1. A method of producing a semiconductor device comprising:
   forming a stacked structure, made up of alternately stacked dielectric and wiring layers, on a surface of a semiconductor chip, said surface having connecting electrodes and a protection layer provided thereon; and
   forming external electrodes for external electrical connection on the stacked structure so that the external electrodes are electrically connected to the semiconductor chip via the wiring layers,
   said forming the stacked structure comprising:
   a process of forming a lower electrode;
   a process of forming, by a heating process, a binder on a surface of a particulate material that has an average grain diameter in a range of 10 nm to 10 μm;
   wherein the binder has a mass % in a range of 0.1 mass % to 50 mass % when a weight of the particulate material added with the binder is taken as a reference that is 100 mass %;
   a process of spraying an aerosol particulate material, formed by the particulate material having the binder formed on the surface thereof, in order to cover the lower electrode and forming one layer selected from a group consisting of a capacitor dielectric layer, a resistor layer and a conductor layer;
   a process of selectively removing the one layer; and
   a process of forming an upper electrode on the one layer.

2. The method of producing the semiconductor device as claimed in claim 1, wherein the process of selectively removing the one layer carries out a wet etching using a mask that is formed by a resist layer formed on the one layer.

3. The method of producing the semiconductor device as claimed in claim 1, wherein the process of selectively removing the one layer carries out, between the process of forming the lower electrode and the process of forming the one layer, a process of covering the lower electrode by a resist layer and a process of selectively removing the resist layer, so that the one layer is selectively removed by simultaneously removing the resist layer and the one layer formed thereon.

4. The method of producing the semiconductor device as claimed in claim 1, wherein at least one of the process of forming the lower electrode and the process of forming the upper electrode is carried out simultaneously as when one of the wiring layers of the stacked structure is formed.

5. The method of producing the semiconductor device as claimed in claim 1, wherein the process of spraying the aerosol particulate material forms the capacitor dielectric layer by spraying a material including one element or a mixture of two or more elements selected from a group consisting of $TiO_2$, $MgO$, $Al_2O_3$, $SiO_2$ and $AlN$, $BaTiO_3$, $Ba(Mg_{1/3}Ta_{2/3})O_3$, $Ba(Co_{1/3}Ta_{2/3})O_3$, $Ba(Co_{1/3}Nb_{2/3})O_3$, $Ba(Ni_{1/3}Ta_{2/3})O_3$, $(BaSr)TiO_3$, $Ba(TiZr)O_3$, $Ba(Zn_{1/3}Nb_{2/3})O_3$, $Ba(Zn_{1/3}Ta_{2/3})O_3$, $BaTi_4O_9$, $Ba_2Ti_9O_{20}$, $CaTiO_3$, $CaZrO_3$, $MgTiO_3$, $Nd_2Ti_2O_7$, $Pb(Mg_{1/3}Nb_{2/3})O_3$, $PbTiO_3$, $PbZrO_3$, $PbZrTiO_3$, $Pb(Ni_{1/3}Nb_{2/3})O_3$, $Pb(Zn_{1/3}Nb_{2/3})O_3$, $SrTiO_3$ and $ZrSnTiO_4$.

6. The method of producing the semiconductor device as claimed in claim 1, wherein the process of spraying the aerosol particulate material forms the resistor layer by spraying a material including one element or a mixture of two or more elements selected from a group consisting of $RuO_2$, $ReO_2$, $IrO_2$, $SrVO_3$, $CaVO_3$, $LaTiO_3$, $SrMoO_3$, $CaMoO_3$, $SrCrO_3$, $CaCrO_3$, $LaVO_3$, $GdVO_3$, $SrMnO_3$, $CaMnO_3$, $Ni$—$Cr$—$O$, $BiCrO_3$, $LaCrO_3$, $LnCrO_3$, $SrRuO_3$, $CaRuO_3$, $SrFeO_3$, $BaRuO_3$, $LaMnO_3$, $LnMnO_3$, $LaFeO_3$, $LnFeO_3$, $LaCoO_3$, $LaRhO_3$, $LaNiO_3$, $PbRuO_3$, $Bi_2Ru_2O_7$, $LaTaO_3$, $BiRuO_3$ and $LaB_6$.

7. The method of producing the semiconductor device as claimed in claim 1, wherein the process of spraying the aerosol particulate material forms the conductor layer by spraying a material including an element or an alloy of two or more elements selected from a group consisting of Cu, Ag, Au, Pt, Pd and Al.

8. The method of producing the semiconductor device as claimed in claim 1, wherein the process of spraying the aerosol particulate material uses a material comprising particulates that are coated with or covered by an aluminum compound as the binder.

9. A method of producing a semiconductor device comprising:
    forming a stacked structure, made up of alternately stacked dielectric and wiring layers; and
    said forming the stacked structure comprising:
    a process of forming one of the wiring layers as a lower electrode;
    a process of forming, by a heating process, a binder on a surface of a particulate material that has an average grain diameter in a range of 10 nm to 10 μm;
    wherein the binder has a mass % in a range of 0.1 mass % to 50 mass % when a weight of the particulate material added with the binder is taken as a reference that is 100 mass %;
    a process of spraying an aerosol particulate material, formed by the particulate material having the binder formed on the surface thereof, in order to cover the lower electrode and forming one layer selected from a group consisting of a capacitor dielectric layer, a resistor layer and a conductor layer;
    a process of selectively removing the one layer;
    a process of forming another one of the wiring layers as an upper electrode on the one layer.

10. The method of producing the semiconductor device as claimed in claim 9, wherein said forming the stacked structure forms the stacked structure on a semiconductor chip, and further comprising:
    forming external electrodes for external electrical connection on the stacked structure so that the external electrodes are electrically connected to the semiconductor chip via the wiring layers.

11. The method of producing the semiconductor device as claimed in claim 9, further comprising:
    electrically connecting a semiconductor device to the wiring layers of the stacked structure.

12. The method of producing the semiconductor device as claimed in claim 9, wherein said forming the stacked structure comprises:
    a process of forming one of the dielectric layers surrounding the one layer.

13. The method of producing the semiconductor device as claimed in claim 1, wherein a vibrator forms the aerosol particulate material, prior to the process of spraying, utilizing one of the group consisting of ultrasonic vibration, electromagnetic vibration and mechanical vibration.

14. The method of producing the semiconductor device as claimed in claim 9, wherein a vibrator forms the aerosol particulate material, prior to the process of spraying, utilizing one of the group consisting of ultrasonic vibration, electromagnetic vibration and mechanical vibration.

15. The method of producing the semiconductor device as claimed in claim 1, wherein the binder is made of an aluminum compound having a mass % in a range of 0.1 mass % to 20 mass % when a weight of the aerosol particulate material added with the binder is taken as a reference that is 100 mass %.

16. The method of producing the semiconductor device as claimed in claim 1, wherein the process of spraying the aerosol particulate material is carried out at room temperature.

17. The method of producing the semiconductor device as claimed in claim 9, wherein the process of spraying the aerosol particulate material is carried out at room temperature.

18. The method of producing the semiconductor device as claimed in claim 9, wherein the binder is made of an aluminum compound having a mass % in a range of 0.1 mass % to 20 mass % when a weight of the aerosol particulate material added with the binder is taken as a reference that is 100 mass %.

* * * * *